US011039535B2

(12) United States Patent
Tay et al.

(10) Patent No.: US 11,039,535 B2
(45) Date of Patent: Jun. 15, 2021

(54) MANUFACTURING HOLES IN COMPONENT CARRIER MATERIAL

(71) Applicant: AT&S (China) Co. Ltd., Shanghai (CN)

(72) Inventors: Seok Kim Tay, Singapore (SG); Abderrazzaq Ifis, Leoben (AT); Haina Wu, Peixian (CN)

(73) Assignee: AT&S (China) Co. Ltd., Shanghai (CN)

( * ) Notice: Subject to any disclaimer, the term of this patent is extended or adjusted under 35 U.S.C. 154(b) by 8 days.

(21) Appl. No.: 16/775,044

(22) Filed: Jan. 28, 2020

(65) Prior Publication Data

US 2020/0253051 A1 Aug. 6, 2020

(30) Foreign Application Priority Data

Jan. 31, 2019 (CN) .................. 201910101368.X

(51) Int. Cl.
*H05K 3/02* (2006.01)
*H05K 1/11* (2006.01)
*H05K 3/00* (2006.01)
*H05K 1/18* (2006.01)

(52) U.S. Cl.
CPC ............ *H05K 1/115* (2013.01); *H05K 1/186* (2013.01); *H05K 3/0035* (2013.01); *H05K 3/0038* (2013.01); *H05K 3/027* (2013.01); H05K 2201/09518 (2013.01); H05K 2201/09827 (2013.01); H05K 2203/107 (2013.01)

(58) Field of Classification Search
CPC ...... H05K 1/115; H05K 3/027; H05K 3/0038; H05K 1/186; H05K 3/0035; H05K 2201/09518; H05K 2203/107; H05K 2201/09827; H05K 2201/09854; H05K 2201/09863; H05K 1/0271
USPC .................................................. 174/262–266
See application file for complete search history.

(56) References Cited

U.S. PATENT DOCUMENTS

| 8,217,278 | B2 * | 7/2012 | Yu ........................ H05K 3/0035 174/262 |
| 2005/0244621 | A1 | 11/2005 | Arai et al. | |
| 2006/0068581 | A1 * | 3/2006 | Kobayashi ........... H05K 3/0035 438/622 |
| 2011/0120762 | A1 * | 5/2011 | Kawai .................... H05K 3/423 174/264 |
| 2015/0034378 | A1 * | 2/2015 | Kajihara ................ H05K 3/427 174/266 |
| 2016/0249463 | A1 * | 8/2016 | Yoshida ................. H05K 3/423 |

FOREIGN PATENT DOCUMENTS

EP 0 969 707 B1 12/2006
JP H09331155 A 12/1997

\* cited by examiner

*Primary Examiner* — Sherman Ng
(74) *Attorney, Agent, or Firm* — Robert A. Blaha; Smith Tempel Blaha LLC

(57) ABSTRACT

A method includes providing an electrically conductive layer structure on top of an electrically insulating layer structure, forming a window in the electrically conductive layer structure and removing material of the electrically insulating layer structure below the window by a first laser beam, and subsequently removing further material of the electrically insulating layer structure below the window by a second laser beam having a smaller size than a size of the window.

21 Claims, 9 Drawing Sheets

MANUFACTURING HOLES IN COMPONENT CARRIER MATERIAL

CROSS-REFERENCE TO RELATED APPLICATION

This application claims priority to Chinese Patent Application No. 201910101368.X filed on 31 Jan. 2019, the disclosure of which is hereby incorporated herein by reference.

TECHNICAL FIELD

Embodiments of the invention relate to a component carrier and a method of manufacturing a component carrier.

Technological Background

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures and/or components embedded in a component carrier with proper quality. Formation of mechanical vias and laser vias, which may be copper filled, may be advantageous for this and other purposes.

SUMMARY

There may be a need to form a laser hole for a component carrier with high quality and efficiency.

According to an exemplary embodiment of a first aspect, a method is provided which comprises providing an electrically conductive layer structure on top of an electrically insulating layer structure, forming a window in the electrically conductive layer structure and removing material of the electrically insulating layer structure below the window by a first laser beam, and subsequently removing further material of the electrically insulating layer structure below the window by a second laser beam having a smaller size than the window.

According to an exemplary embodiment of a second aspect, a method is provided which comprises providing an electrically conductive layer structure on an electrically insulating layer structure, and forming a window in the electrically conductive layer structure and removing material of the electrically insulating layer structure below the window by a laser beam which is configured for promoting heat transfer in the electrically conductive layer structure in horizontal direction and is configured for inhibiting heat transfer in vertical direction.

According to an exemplary embodiment of a third aspect, a component carrier is provided which comprises an electrically insulating layer structure, an electrically conductive layer structure on top of the electrically insulating layer structure, a window in the electrically conductive layer structure, a recess in the electrically insulating layer structure below the window, wherein an overhang of the electrically conductive layer structure with respect to the electrically insulating layer structure at an edge of the window is smaller than or equal to 10 µm, and an electrically conductive material in at least part of the recess.

According to an exemplary embodiment of a fourth aspect, a component carrier is provided which comprises an electrically insulating layer structure, an electrically conductive layer structure on a front side of the electrically insulating layer structure having a window, another electrically conductive layer structure on a back side of the electrically insulating layer structure having another window, and a through hole extending through the electrically insulating layer structure and being at least partially filled with electrically conductive material, wherein the through hole is formed by a recess extending from the window into the electrically insulating layer structure and another recess connected to the recess and extending from the other window into the electrically insulating layer structure, wherein different portions of the recess taper with different steepness, and wherein different portions of the other recess taper with different steepness.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "window" may particularly denote a through hole, in particular a circular through hole, extending through an electrically conductive layer structure as a result of a laser treatment of this electrically conductive layer structure. Descriptively speaking, the energy of the laser beam may remove material of the electrically conductive layer structure in the region of the window.

In the context of the present application, the term "size" of a window and a first or a second laser beam, respectively, may particularly denote a maximum diameter of the preferably circular window and a maximum diameter of the preferably circular first or second laser beam, respectively.

In the context of the present application, the term "configuring a laser beam for promoting heat transfer in horizontal direction and inhibiting heat transfer in vertical direction" may particularly denote that at least one parameter characterizing the laser beam, in particular its energy and/or its operating point, is adjusted so that the heat of the laser energy propagates with a larger or major amount (in particular more than 50% of the laser energy, more particularly more than 80% of the laser energy) in a horizontal direction along the extension of the electrically conductive layer structure rather than vertically into material of the electrically insulating layer structure below. Thus, only a smaller or minor amount (in particular less than 50% of the laser energy, more particularly less than 20% of the laser energy) of the laser energy may propagate vertically.

In the context of the present application, the term "overhang" may particularly denote a length of the electrically conductive layer structure directly adjacent to the window over which length the respective portion of the electrically conductive layer structure hangs freely in a cantilever fashion spaced with regard to the electrically insulating layer structure and is not supported from below by material of the electrically insulating layer structure along the extension of the overhang. What concerns the above statement that overhanging material may be locally not supported, it should be said that the overhang may relate to the substantially resin free area beneath the respective electrically conductive layer structure. However, a person skilled in the art will understand that some residue resin might be present within a gap relating to the overhang. In order to quantitatively determine or measure the value of the overhang, the length of the substantially resin-free (wherein resin may refer to the electrically insulating layer structure) undercut directly under an overhanging electrically conductive layer structure may be measured (in particular even if it is not the most receding point or total relief below the overhanging electrically conductive layer structure, for example copper layer). In other words, for measuring the overhang, the undercut directly below the electrically conductive layer structure may be measured.

In the context of the present application, the term "through hole" may particularly denote a hole extending completely through an entire electrically insulating layer structure, and which may be formed in particular and preferably by laser processing. Thus, the through hole may be a laser through hole. Such a through hole may have, for example, two opposing tapering portions extending from the two opposing main surfaces of the electrically insulating layer structure. A through hole may be manufactured for instance by a combination of laser shots from the front side and the back side, i.e. from the two opposing main surfaces of, the electrically insulating layer structure. One or more laser shots may be performed from each of these sides. Formation of a through hole by laser processing from only one main surface may be possible as well. Furthermore, formation of a through hole may be carried out as well by other methods than laser processing, for instance by a plasma treatment.

According to an exemplary embodiment of the first aspect of the invention, a window in an electrically conductive layer structure is firstly opened by a first laser beam which removes only a small portion of the material of the electrically insulating layer structure under the window. This first laser treatment is followed by a second laser treatment with a second laser beam which has a smaller size than the size of the window opened by the first laser beam. It has turned out that the overhang of material of the electrically conductive layer structure relative to material of the electrically insulating layer structure beneath can be kept very small according to such an embodiment. As a result, a subsequent process of filling the manufactured laser hole with an electrically conductive material such as plated copper can be carried out highly efficiently and without the risk of forming large voids in the laser hole.

According to an exemplary embodiment of the second aspect of the invention, the configuration of the laser beam used for forming a window in an electrically conductive layer structure above an electrically conductive layer structure of component carrier material may be specifically adapted for preventing the generation of a pronounced overhang below an edge of the window. It has turned out surprisingly that by a specific configuration in particular of the energy of the laser beam, the laser energy may be predominantly used for removing material of the electrically conductive layer structure rather than spending the majority of the laser energy for burning material of the electrically insulating layer structure beneath the window.

According to an exemplary embodiment of the third aspect of the invention, a component carrier is provided which has a recess in an electrically insulating layer structure below an electrically conductive layer structure, which recess may be formed by at least two laser beams. Highly advantageously, an overhang of the electrically conductive layer structure with respect to the electrically insulating layer structure at an edge of the window is smaller than or equal to 10 µm—which can be achieved by the methods according to the first and second aspect.

According to an exemplary embodiment of the fourth aspect of the invention, a laser through hole in a thick electrically insulating layer structure may be efficiently produced with high quality and low overhang by connecting two partial recesses formed by two pairs of laser beams irradiating the component carrier pre-form from two opposing main surfaces of the thick electrically insulating layer structure. Each of the two opposing main surfaces is covered by a respective electrically conductive layer structure in which firstly a respective window may be formed by a respective first laser beam, followed by a deepening of the respective recess by a respective second laser beam. As a result of this processing, two recesses connected in an interior of the electrically insulating layer structure may be formed, each composed of two tapering portions. A respective more shallow or relatively shallower gently inclined exterior portion is followed by a respective more steep or relatively steeper interior portion on each of the two sides, wherein exterior and interior is to be understood to relate to the respective main surfaces of the electrically insulating layer structure. A correspondingly formed through hole extending through an evenly thick electrically insulating layer structure may be efficiently filled with electrically conductive material such as plated copper, to thereby establish a vertical interconnect through the electrically insulating layer structure with high electric reliability.

More generally, exemplary embodiments of the invention may use different laser beams for laser drilling with a well-controlled ratio to avoid laser reflection under the opening in the electrically conductive layer structure (in particular a copper opening). It has turned out that different independent laser shots may be efficiently generated to create the opening and the connection for better control of both aspects. As a result, a low copper overhang with a high via connection reliability may be obtained. Apart from this, a high process stability may be achieved. Highly advantageously, substantially no additional effort in terms of hardware and processing resources is required to carry out the described process.

In the following, further exemplary embodiments of the methods and the component carriers will be explained, which apply to all mentioned aspects of the invention.

In an embodiment, the second laser beam has a smaller size (in particular diameter) than a larger size (in particular diameter) of the first laser beam. It is also possible that a cross-sectional area of the first laser beam is larger than a cross-sectional area of the second laser beam. With such a design, the value of the overhang can be rendered very small. It is also possible that a cross-sectional area of the window is larger than a cross-sectional area of the second laser beam.

In an embodiment, the method comprises directing the second laser beam entirely through the window onto the electrically insulating layer structure. In particular, the second laser beam may extend over its entire width within the window. In such a configuration, no undesired reflection of the second laser beam on the exterior surface of the electrically conductive layer structure can occur.

In an embodiment, the method comprises providing a further electrically conductive layer structure at a bottom of an electrically insulating layer structure, and removing material of the electrically insulating layer structure by the first laser beam only to such an extent that the further electrically conductive layer structure is not exposed by the first laser beam. Thus, the electrically insulating layer structure may be sandwiched between the electrically conductive layer structure facing the laser beams and the further electrically conductive layer structure facing away from the laser beams. The first laser beam may be configured so that it does not extend through the entire thickness of the electrically insulating layer structure, so that the first laser beam will not expose the further electrically conductive layer structure. This has a positive impact on the overhang, which can be kept very small.

In an embodiment, the method comprises removing material of the electrically insulating layer structure by the second laser beam to such an extent that the further electrically conductive layer structure is exposed by the second laser beam. Thus, only the second laser beam will expose the further electrically conductive layer structure and will therefore extend through the entire thickness of the electrically insulating layer structure. Due to the smaller size of the second laser beam compared to the window (and preferably compared to the first laser beam), no further increase of the value of the overhang will occur as a result of the second laser beam in the described configuration.

In an embodiment, the method comprises a component embedded below at least part of the electrically insulating layer structure, wherein the further electrically conductive layer structure is a pad of the component. When exposing a pad of an embedded component (such as a semiconductor chip) only by the second laser beam and not already by the first laser beam, the sensitive component can be safely prevented from damage which might occur when coming in direct contact with the broader first laser beam.

In an embodiment, the method comprises, after the removing of the material by the second laser beam, removing other material by at least one third laser beam. For instance, the third laser beam may have a smaller size than the window. The third laser beam may be directed onto the electrically insulating layer structure from the same side as the first two laser beams. At least one further laser beam may allow precisely designing the shape of the laser hole. In order to prevent an undesired increase of the overhang, such a third or further laser beam may also have a size smaller than the window.

In an embodiment, a ratio between a size of the window and a size of the second laser beam is larger than or equal to 1.1, in particular is larger than or equal to 1.2. With this design rule, undesired increase of the over-hang by the second laser beam can be safely prevented.

In an embodiment, a difference between a size of the window and a size of the second laser beam is in a range between 3 µm and 50 µm, in particular in a range between 5 µm and 15 µm. With this design rule, undesired increase of the overhang by the second laser beam can be safely prevented as well.

In an embodiment, the method comprises generating at least one of the first laser beam and the second laser beam (preferably both) by a $CO_2$ laser. Alternatively, one or both of the laser beams may also be realized by another type of laser, for example by a UV (ultraviolet) laser. However, with exemplary embodiments of the invention it is also possible to use a $CO_2$ laser having a very high energy impact and allowing for a rapid processing of the laser holes. The reason for this is that with the described design of the two or more laser shots, in which the second and optionally all further laser shots has/have a size smaller than the window formed by the first laser shot, it becomes possible to use of a $CO_2$ laser without the above-described negative impact on the overhang. Furthermore, as will be described below in further detail, when configuring the $CO_2$ laser characteristic so that with the first laser shot heat transfer occurs substantially only in horizontal direction and thus predominantly within the electrically conductive layer structure for window formation, the high heat impact of a $CO_2$ laser is not disturbing for the characteristic of the formed laser hole. This particularly holds when the energy of the $CO_2$ laser is adjusted so that the obtained window size is sufficiently below the maximum opening size for a given aperture, as described below referring to FIG. 25.

In an embodiment, the method comprises at least partially filling at least one of a window and a recess resulting from the removal of the material of the electrically insulating layer structure with electrically conductive material, in particular by plating. For instance, it is first possible to form a seed layer (for example made of copper) by electroless deposition, followed by a galvanic deposition of additional electrically conductive material on the seed layer (in particular also copper material). As a result, a copper filled laser via can be obtained. It is possible that the seed layer has a thickness above 1 µm and/or that several cumulative seed layers are provided. For example, a thickness of a seed layer or a cumulative thickness of a plurality of seed layers may be in a range between 0.5 µm and 5 µm. When multiple seed layers are provided, they may comprise an organic (for instance polymer) layer, a palladium layer, and/or a copper layer.

In an embodiment, the method comprises directing the first laser beam directly onto the electrically conductive layer structure, in particular without protection from a base film, any other protective cover and/or without previous surface treatment of the exterior surface of the electrically conductive layer structure. Conventionally, for obtaining a smooth laser hole, the (in particular copper) surface to be treated by a laser beam needs to be prepared by a previous surface treatment. In particular, such a conventional surface treatment may involve covering the copper surface with a bond film (in particular an organic film with black oxide thereon) to suppress undesired reflection of laser energy during laser processing. Otherwise, laser reflection may be so strong that no laser hole with proper quality may be obtained. Conventionally, undesired phenomenon such as copper splash (i.e. mountains of copper formed around the window of the electrically conductive layer structure) can only be suppressed with such a surface treatment prior to laser processing. However, according to an exemplary embodiment of the invention (in particular in terms of the first aspect and the second aspect, as described above), it has turned out that the described surface treatment, in particular a coverage of the electrically conductive layer structure, may be dispensable, in particular when very thin electrically conductive layer structures are implemented. Preferably, a thickness of the copper foil forming the electrically conductive layer structure may thus be not more than 5 μm, in particular not more than 3.5 μm, more particularly not more than 3 μm.

In an embodiment, the method comprises providing another electrically conductive layer structure on a bottom of the electrically insulating layer structure, forming another window in the other electrically conductive layer structure and removing material of the electrically insulating layer structure above the further window by a third laser beam, and subsequently removing still further material of the electrically insulating layer structure above the other window by a fourth laser beam having a smaller size than the other window. Thus, in particular when a thick electrically insulating layer structure shall be provided with a laser through hole, processing of the thick electrically insulating layer structure covered on both opposing main surfaces thereof with a respective electrically conductive layer structure (such as a copper foil) by the two laser shot procedure described above at each of the two opposing main surfaces allows obtaining a smooth high quality laser hole with sufficiently small overhang. In order to achieve this, a first laser shot for opening a window in the top electrically conductive layer structure may be followed by a second laser shot having a smaller size than the formed window. Moreover, a third laser shot may be applied from the opposing main surface of the layer stack for opening another window in the bottom electrically conductive layer structure, followed by a fourth laser shot having a smaller size than the formed other window at the bottom side.

In an embodiment, the method comprises connecting a first blind hole formed by the first laser beam and the second laser beam in a top side region of the electrically insulating layer structure with a second blind hole formed by the third laser beam and by the fourth laser beam in a bottom side region of the electrically insulating layer structure. Thus, the described four laser shots may combine two blind-hole type recesses extending from the two opposing main surfaces of the layer stack to obtain a through hole extending through the entire thick electrically insulating layer structure. The through hole may be filled with conductive material to establish an electric vertical through connection.

In an embodiment, the first laser beam is configured to introduce more of its energy horizontally into the electrically conductive layer structure than vertically into the electrically insulating layer structure. Preferably, the first laser beam is configured to introduce substantially its entire energy horizontally when opening the window in the electrically conductive layer structure. By taking this measure, the majority of the energy of the first laser shot may be used for opening the window in the electrically conductive layer structure, while only a smaller amount of the laser energy will propagate into the electrically insulating layer structure for burning resin material here.

In an embodiment, the first laser beam and the second laser beam are independent from one another. Thus, the properties (such as energy, the working point, etc.) of the two laser beams may be adjusted separately and therefore in accordance with the respective tasks. In particular, the energy of the two laser beams may be adjusted separately to specifically operate the first laser beam at an instable processing point according to FIG. 25.

In an embodiment, the method comprises promoting heat transfer in horizontal direction and inhibiting heat transfer in the vertical direction by defocusing the laser beam or by operating the laser beam at an instable processing point (see reference numeral 222 in FIG. 25). At the instable processing point, the window size formed by the laser beam is intentionally adjusted smaller than a maximum obtainable window size by down-regulating or reducing its laser energy to such a degree that the laser energy propagates substantially horizontally rather than vertically. More particularly, the laser beam may be operated at a working point at which the laser energy-window diameter curve (see FIG. 25) has not reached a plateau (in particular is below a 90% level). In other words, the method may comprise promoting heat transfer in horizontal direction and inhibiting heat transfer in the vertical direction by destabilizing the laser beam. By intentionally defocusing and/or destabilizing the first laser beam, i.e. operating the first laser beam at an energy level outside of the range for forming the widest possible laser hole in the electrically insulating layer structure, it has turned out surprisingly that the heat impact in vertical direction (i.e. into the electrically insulating layer structure) by the first laser shot can be efficiently suppressed, while the laser energy of the first laser beam will be injected to a high percentage into the portion of the electrically conductive layer structure in which the window is to be formed.

In an embodiment, the method comprises promoting heat transfer in the horizontal direction and inhibiting heat transfer in the vertical direction by correspondingly adjusting the energy level of the laser beam impacting the electrically conductive layer structure and the electrically insulating layer structure. In other words, a highly appropriate design parameter for increasing heat transfer horizontally and simultaneously decreasing heat transfer vertically is the adjustment of the energy of the first laser beam, as will be described below in further detail referring to FIG. 24 and FIG. 25.

In a preferred embodiment, the method comprises adjusting an energy of the laser beam so that a size of the window is obtained which is smaller than or equal to 90% of a maximum opening size for a given aperture, in particular which is in a range between 60% and 90%, more particularly between 70% and 85%, of a maximum opening size for a given aperture. Descriptively speaking, the first laser beam may be intentionally operated at an instable processing point rather than at a stable processing point so that the window size in the electrically conductive layer structure is significantly smaller than a maximum window size obtained by a sufficiently high energy of the first laser beam. In contrast to operating the first laser beam at an energy at which a window size/laser energy curve has reached or has substantially reached a plateau value, the first laser beam may be driven at a significantly lower energy. As a result, the obtained window size in the electrically conductive layer structure is significantly smaller than the maximum achievable window size. Although, at first glance, this appears to be sub-optimal, it has been surprisingly found that intentionally operating the laser a relatively low energy results in an efficient material removal of the electrically conductive layer structure in horizontal direction by the laser energy, while only a minor part of the laser energy will go into the vertical direction and therefore into the electrically insulating layer structure. Surprisingly, this has a highly positive impact on the overhang which can therefore be efficiently reduced.

In an embodiment, a first portion of the recess directly beneath the electrically conductive layer structure tapers less steep than a second portion of the recess beneath the first portion. Correspondingly, a first slope of a first portion of the recess directly beneath the electrically conductive layer structure may be lower than a second slope of a second portion of the recess beneath the first portion. Thus, the first portion of the recess formed by the first laser shot may be more shallow or relatively shallower than the steeper second portion of the recess formed by the second laser shot with the beam size smaller than the window size.

In an embodiment, the recess has a kink between the first portion and the second portion. Such a kink or geometrical discontinuity between the first laser shot formed first portion and the second laser shot formed second portion of the recess may correspond to a convex section of the side wall of the electrically insulating layer structure delimiting the recess. Descriptively speaking, the mentioned kink is a fingerprint of the process in which a window in the electrically conductive layer structure is first opened by a first laser shot followed by a second laser shot having a size smaller than the window size. The kink is formed by the combination of the impact of the first laser beam and of the second laser beam on the electrically insulating layer structure. While the first laser beam substantially defines the geometry of the first portion, the second laser beam fully extending through the electrically insulating layer structure and being partially reflected at a further electrically conductive layer structure below the electrically insulating layer structure defines the geometry of the second portion and thereby forms the mentioned kink.

In an embodiment, the kink is located inside of the window. More precisely, in a viewing direction from an exterior of the recess into an interior of the recess through the window corresponding to a propagation direction of the laser beams, the kink is visible, for instance as a circumferential annular discontinuity.

In an embodiment, an angle between a vertical direction and a side wall delimiting the recess in the first portion is below 90°, in particular is in a range between 20° and 70°. Correspondingly, an angle between a vertical direction and a side wall delimiting the recess in the second portion may be in a range between 0° and 30°, in particular between 5° and 20°. The exact value of these angles is defined by process parameters such as the width of the two laser beams, the energy of laser beams, etc.

In an embodiment, the angle between the vertical direction and a side wall delimiting the recess in the first portion is larger than the angle between the vertical direction and a side wall delimiting the recess in the second portion. A corresponding recess geometry has turned out to be advantageous for a subsequent plating procedure during which the recess may be substantially entirely filled with electrically conductive material such as copper. Thus, the described procedure not only allows manufacturing a smooth laser hole, but also promotes a void-poor or even void-free filling of the laser hole with copper or another appropriate electrically conductive material.

In an embodiment, a side wall delimiting the recess in the second portion tapers downwardly towards a vertical axis. Descriptively speaking, each of the first portion of the second portion may have substantially a frustoconical shape with different opening angles.

In an embodiment, the window has a size of not more than 70 µm, in particular not more than 50 µm. Thus, the described manufacturing process is particularly appropriate for manufacturing small vias. In case of a 50 µm wide copper opening on a 40 µm thick dielectric, a large overhang may induce inclusion during via filling as the copper opening gets closed first before filling the entire via due to the large volume created by the overhang. When being able to process with low overhang level as a result of the above-described open window processing method according to an exemplary embodiment of the invention, applications with small vias become possible. In addition, using two independent laser beams allows a better control of the connection diameter, for instance at 40 µm which is highly beneficial for registration.

In an embodiment, a thickness of the electrically insulating layer structure is at least 100 µm, in particular at least 150 µm, more particularly at least 200 µm. Such an embodiment may be particularly advantageous in terms of the fourth aspect of the invention. Forming a laser hole in a thick electrically insulating layer structure has been conventionally problematic. However, with the architecture according to an exemplary embodiment of the invention involving a window opened by a first laser beam in combination with a second laser beam being narrower than the window and propagating only through a central portion of the window, and when applying this procedure to each of two opposing main surfaces of an electrically insulating layer structure each being covered with a respective electrically conductive layer structure, a smooth laser hole with small overhang on both sides may be obtained which can be properly filled with electrically conductive material such as copper, for example by plating. Thus, forming laser through holes with high quality even in a thick dielectric body becomes possible.

In an embodiment, the component carrier comprises another electrically conductive layer structure on a bottom of the electrically insulating layer structure, a further window in the other electrically conductive layer structure, and another recess in the electrically insulating layer structure above the further window, wherein the electrically conductive material fills at least part of the other recess as well. Both electrically conductive layer structures may be metallic layers such as copper foils. The electrically insulating layer structure may comprise resin (for instance epoxy resin) and may optionally include reinforcing particles (such as glass spheres or glass fibers). More specifically, the electrically insulating layer structure may be made of prepreg material.

In an embodiment, different portions of the recess beneath the electrically conductive layer structure taper with different steepness, wherein different portions of the other recess above the other electrically conductive layer structure taper with different steepness as well. Such a geometry may be obtained by the described combination of the first laser shot opening a window in an electrically conductive layer structure followed by a second laser shot with smaller size and propagating completely through the window.

In an embodiment, an overhang of the other electrically conductive layer structure with respect to the electrically insulating layer structure at an edge of the other window is smaller than or equal to 10 µm. As can be taken for instance from FIG. 10, the value of the overhang may be reliably below 10 µm when forming a laser hole as described above. A maximum of a distribution of the overhang value for multiple holes may even be in the range of about 5 µm.

In an embodiment, the thickness of the electrically conductive layer structure is less than 5 µm, in particular less than 3.5 µm, more particularly less than or equal to 3 µm. Thus, extremely thin copper foils may be used according to exemplary embodiments as electrically conductive layer structures, in particular on the top side. More specifically, thin copper foils (in particular with a thickness of not more than 5 µm) may be used and may be directly (i.e. without surface treatment or surface coverage by a reflection suppressing material such as black oxide) used as a basis for the described two-shot laser process. Drilling such thin copper foils requires a well-controlled laser process to avoid high copper overhang which cannot be etched away to avoid exposing the laminate. Processing with low copper overhang on thin foils is highly challenging especially when there is no surface treatment. Indeed, the required high energy to open the copper will get easily transferred to the resin below the thin foil and generate then the undercut. However, when reducing the energy, a high copper splash will be found around the via that cannot be etched away. However, by using the above-described concept of a first laser shot opening a window in an electrically conductive layer structure and a subsequent second narrower laser shot allows avoiding the above defects.

When a laser through hole is formed according to an exemplary embodiment in a thick electrically insulating layer structure of for instance more than 100 μm, two connected recesses may constitute the through hole and may be laser threaded in two opposing main surfaces of the sandwich structure of the electrically insulating layer structure covered by two electrically conductive layer structures. In such an embodiment, a first portion of the upper recess directly underneath the electrically conductive layer structure may taper less steeply than a second portion of the upper recess underneath the first portion. In particular, a first kink or convex discontinuity may be formed (for example as an annular structure) between the first portion and the second portion. Correspondingly, a third portion of the other or lower recess directly above the other electrically conductive layer structure may taper less steeply than a fourth portion of the other or lower recess above the third portion. In particular, a second kink or convex discontinuity may be formed (for example as a further annular structure) between the third portion and the fourth portion. Such a geometry is shown, for example, in FIG. 15.

As mentioned above, at least one component may be embedded in the component carrier, in particular directly below the further electrically conductive layer structure which may for example be a pad of the component. More generally, at least one component which may be embedded in and/or surface mounted on the component carrier can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite base structure) or may be a paramagnetic element. However, the component may also be a substrate, an interposer or a further component carrier, for example in a board-in-board configuration. One or more components may be surface mounted on the component carrier and/or may be embedded in an interior thereof. Moreover, also other than the mentioned components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may consist of at least a layer of glass, silicon (Si) or a photo-imageable or dry-etchable organic material like epoxy-based Build-Up films or polymer compounds like Polyimide, Polybenzoxazole, or Benzocyclobutene.

In an embodiment, dielectric material of the at least one electrically insulating layer structure at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates may be used as well. For high-frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, electrically conductive material of the electrically conductive layer structure and/or at least one further electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2 and FIG. 3 illustrate cross-sectional views of structures obtained during carrying out a method of manufacturing a component carrier with a laser via, shown in:

FIG. 12, FIG. 13 and FIG. 14 illustrate cross-sectional views of structures obtained during carrying out a method of manufacturing a component carrier with a laser via, shown in:

DETAILED DESCRIPTION OF ILLUSTRATED EMBODIMENTS

Figure 1:
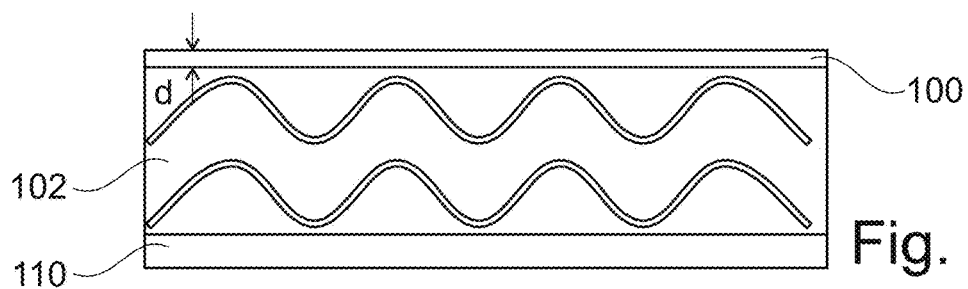

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a window may be opened by a laser shot in an electrically conductive layer structure above an electrically insulating layer structure to obtain a very low value of the undesired phenomenon of overhang, in particular for correspondingly opening the window for obtaining an overhang of 10 μm or less.

In existing component carriers using an ultra-thin copper foil as electrically conductive layer structure and prepreg as electrically insulating layer structure, the copper overhang can exceed 14 µm under normal laser process, which is a big challenge for inclusion after via filling. Thus, it would be highly desirable to decrease copper overhang.

According to an exemplary embodiment of the invention, the copper overhang performance may be significantly improved and may be reduced up to or even below 10 µm. The overhang is a result of two phenomena under a traditional laser method with the same laser beam size used for two subsequent laser shots. A first phenomenon is the overheat by the first shot happening when the laser beam gets in contact with the panel surface to open the copper foil. In addition to the drilled surface, the laser beam energy profile creates an affected zone where the heat goes through the ultra-thin copper and removes resin below creating then the overhang. The other part of the overhang comes from the additional shot's reflection. Indeed, under same beam size of the first shot, the diameter of the laser beam is bigger than the opening and the part of the laser beam reflection will go to the via wall inducing then a larger overhang.

In order to overcome such shortcomings, an exemplary embodiment of the invention creates a first laser shot using a bigger beam size, which will create a large window in the electrically conductive layer structure for a subsequent smaller second laser beam. The latter may have a size smaller than the size of the window and can clean the bottom via and get reflected completely out of the via without significantly burning the via wall. Then, the copper overhang only results from the first laser shot, thus can be controlled below 10 µm.

Descriptively speaking, while two laser shots are dependent from one another and have a similar laser beam size in a conventional laser drilling procedure, exemplary embodiments of the invention implement two independent laser shots with different beam size. An embodiment of such a method may use a bigger mask for the first laser shot to obtain a desired opening diameter of the window, and then using a smaller mask for the second laser shot to clean the hole. Highly advantageously, an exemplary embodiment implements a large window formation process using a laser beam for opening the window in the electrically conductive layer structure (such as a metallic layer, more specifically a copper foil), followed by a narrower subsequent other laser beam propagating only through a sub-portion of the window. As a result of this process, a unique via shape can be obtained.

Using two (or more) independent laser shots for opening a window in an electrically conductive layer structure and for forming a laser hole in an underneath electrically insulating layer structure provides more flexibility for the via design. In particular, it may be possible to reach 50 µm vias with the described method while a general laser capability for laser drilling is presently at 65 µm. Thus, exemplary embodiments of the invention enable the formation of highly reliable vias and reduce the risk for undesired phenomena such as inclusion, cracks and wedge.

An exemplary embodiment of the invention makes also a better control of the connection diameter possible. Indeed, as the second laser shot is independent from the first laser shot, it can be designed for different connection diameter possibilities. Moreover, a better registration accuracy may be achieved than with conventional procedures: As the connection diameter can be well controlled, the registration to the inner layers gets improved. Also, as the overhang is smaller, the pad breakout risk is smaller.

Exemplary embodiments of the invention may be implemented with all kinds of component carrier technologies, including printed circuit board (PCB) applications, IC substrate applications, component carrier applications with one or more embedded components, etc. In particular, such component carriers may be formed with ultra-thin copper foils, thin or thick dielectric layers, RCC (resin coated copper) materials, small via size, etc.

According to an exemplary embodiment of the invention, only one dielectric layer is processed by the two laser shots. In other words, the electrically insulating layer structure may be a continuous structure and may be made subject of a laser processing with the two or more laser shots, as described above. In such a procedure, it is possible to open the copper layer (or more generally an electrically conductive layer) by the first laser beam itself, and the first laser beam may also partially go through the insulating layer.

When carrying out a method according to an exemplary embodiment of the invention, a via shape may be obtained which may be characterized by a specific ratio between the copper opening and the connection diameter. Moreover, a possible shift between the opening and connection centers may be formed. Beyond this, such as manufacturing method may result in a very low copper overhang of 10 µm or less.

With the pure laser processing architecture for window opening and via formation according to an exemplary embodiment of the invention, it may be advantageously possible to make the formation of photo lines dispensable. Another advantage is that the described two shot laser processing method with smaller second shot allows for direct drilling without previous surface treatment (such as formation of a bond film with black oxide for suppressing undesired reflection of laser energy). Apart from the described two laser shots, it is possible to carry out at least one further laser shot to design a desired shape of the laser hole.

Figure 2:
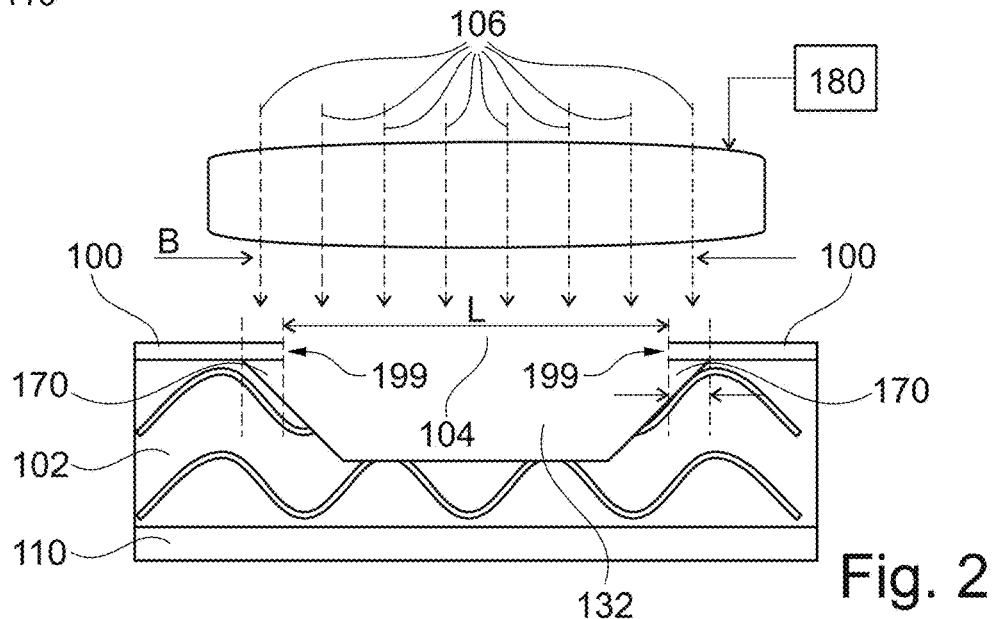
Figure 3:
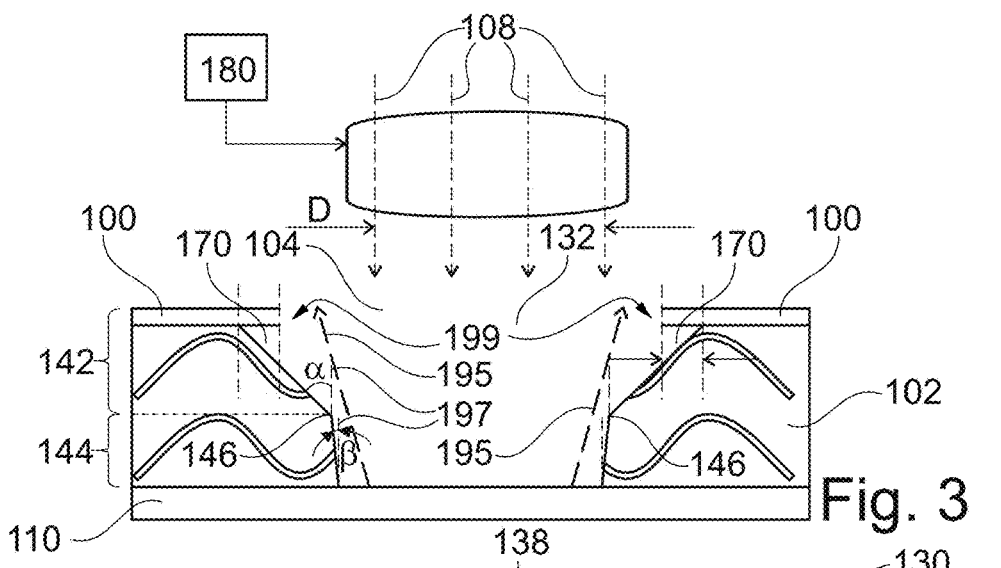
Figure 4:
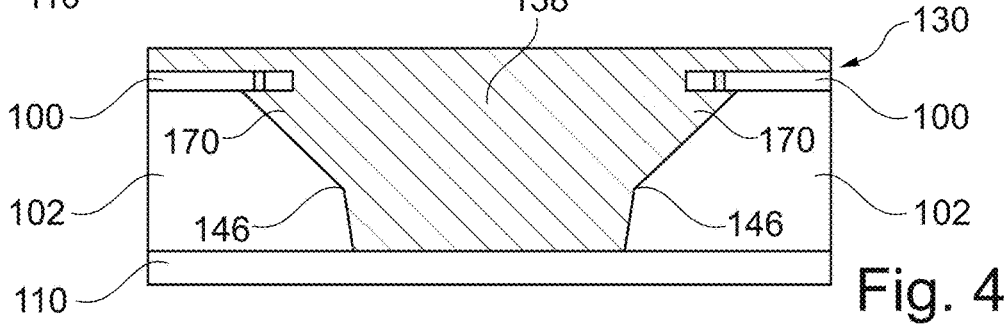
FIG. 4, by a double laser shot treatment according to an exemplary embodiment of the invention.

FIG. 1 to FIG. 4 illustrate cross-sectional views of structures obtained during carrying out a method of manufacturing a component carrier 130 with a laser via, shown in FIG. 4, by a double laser shot according to an exemplary embodiment of the invention.

Referring to FIG. 1, a layer stack is shown which is composed of an electrically conductive layer structure 100 on top of an electrically insulating layer structure 102 being arranged, in turn, on a further electrically conductive layer structure 110 at a bottom of the electrically insulating layer structure 102. The electrically conductive layer structures 100, 110 may be copper foils. A thickness, d, of the electrically conductive layer structure 100 may be for example as small as 3.5 µm. The electrically insulating layer structure 102 may for example comprise resin (in particular epoxy resin), optionally filled with reinforcing particles (such as glass fiber or glass spheres). For instance, the electrically insulating layer structure 102 may be a prepreg layer.

Referring to FIG. 2, a through-hole type window 104 is laser drilled in the electrically conductive layer structure 100 by a first laser beam 106. The first laser beam 106 may be generated by a high-power and high wavelength $CO_2$ laser source allowing fast laser drilling and having properties which may be adjusted by a control unit 180 (such as a processor). During this first laser shot by the first laser beam 106, a significant portion of the laser energy is spent for removing metallic material of the electrically conductive layer structure 100 for forming the window 104. Simultaneously, only a small part of the material of the electrically insulating layer structure 102 below the window 104 is removed by the first laser beam 106. However, the first laser beam 106 removes material of the electrically insulating layer structure 102 only to such an extent that the further electrically conductive layer structure 110 is not exposed by the first laser beam 106. In other words, the first laser beam 106, in particular its energy impact on the layer stack, is adjusted under control of the control unit 180 so that it does not extend vertically through the entire electrically insulating layer structure 102.

As a result of this processing of the shown layer stack by the first laser beam 106, an overhang 170 in form of a void or narrow gap between electrically conductive layer structure 100 and electrically insulating layer structure 102 at the edge 199 of the window 104 is generated. The overhang 170 has a substantially triangular shape in the cross-sectional view of FIG. 2. The overhang 170 of the electrically conductive layer structure 100 with respect to the electrically insulating layer structure 102 at the circumferential edge 199 of the window 104 is smaller than or equal to 10 μm. In particular by correspondingly adjusting the energy of the first laser beam 106 to be sufficiently low (compare FIG. 25 described below), this overhang 170 may be kept very small, for instance will not exceed 10 μm.

Advantageously, the first laser beam 106 may be directed directly onto the electrically conductive layer structure 100 without protection by a base film or the like and/or without previous surface treatment of the upper main surface of the electrically conductive layer structure 100. When keeping the energy of the first laser beam 106 sufficiently small as described below, the energy impact of the laser energy will be substantially horizontal according to FIG. 2 and will mainly contribute to the formation of the window 104 in the electrically conductive layer structure 100 rather than extending substantially downward and cutting through the entire vertical extension of the electrically insulating layer structure 102. In other words, the first laser beam 106 may be configured and may be adjusted by the control unit 180 to introduce much more of its energy horizontally into the electrically conductive layer structure 100 than vertically into the electrically insulating layer structure 102. Thus, the first laser beam 106 is configured to introduce its energy substantially horizontally when opening the window 104 in the electrically conductive layer structure 100. During formation of the window 104, the laser energy diffuses substantially only horizontally, not vertically with the configuration according to FIG. 2. With the described laser processing, formation of window 104 with low overhang 170 may be achieved even without surface treatment or surface coverage of the electrically conductive layer structure 102 to suppress reflection of laser energy at an upper surface thereof. As shown in FIG. 2, the diameter or size of the first laser beam 106 reaching the surface of the electrically conductive layer structure 100 is denoted as B, whereas the diameter or size of the window 104 is denoted as L.

Referring to FIG. 3, after having completed laser treatment of the shown layer stack by the first laser beam 106, the obtained structure according to FIG. 2 may be made subject to further laser processing by an independent second laser beam 108 which can be adjusted by the control unit 180 as well. Preferably, also the second laser beam 108 is generated by a $CO_2$ laser source. The second laser beam 108 may remove further material of the electrically insulating layer structure 102 below the window 104. As shown in FIG. 3, the second laser beam 108 has a smaller diameter or size D than the size L of the window 104 formed by the first laser beam 106. For instance, the window 104 has a size L of 50 μm. The second laser beam 108 has a smaller size D than the larger size B of the first laser beam 106. Preferably, a difference between the size L of the window 104 and the size D of the second laser beam 108 is in a range between 5 μm and 15 μm. Moreover, as can be taken from FIG. 3 as well, the second laser beam 108 propagates over its entire width or size D through and within the window 104 and will therefore not interact with the exterior main surface of the electrically conductive layer structure 100. In other words, the second laser beam 108 is directed entirely through the window 104 onto the electrically insulating layer structure 102. The second laser beam 108 is furthermore controlled by the control unit 180 to remove material of the electrically insulating layer structure 102 to such an extent that the further electrically conductive layer structure 110 is exposed by the second laser beam 108. In other words, the second laser beam 108 extends through the entire vertical thickness of the electrically insulating layer structure 102. The upper main surface of the further electrically conductive layer structure 110 serves as a stop layer for the second laser beam 108, i.e. is not removed by the second laser beam 108. Thus, in contrast to the first laser beam 106, the second laser beam 108 propagates up to the bottom of the resin layer and therefore exposes the further electrically conductive layer structure 110 to render it accessible for an electric contact to be formed. Therefore, the narrower second laser beam 108 cleans the laser hole and enables an electric connection of the embedded copper of the further electrically conductive layer structure 110.

As can be taken from FIG. 3, the second laser beam 108 may be reflected partially at the exposed upper main surface of the further electrically conductive layer structure 110, see reflected beam portion 195. However, due to the described geometric conditions (in particular the fact that the second laser beam 108 has a size smaller than the window 104), the second laser beam 108 will not further increase the size of the overhang 170. In other words, the size of the overhang 170 is substantially defined by the first laser beam 106 only (however also only to a moderate extent), but will advantageously not be further increased by the second laser beam 108. The overhang 170 of the electrically conductive layer structure 100 with respect to the electrically insulating layer structure 102 at the edge 199 of the window 104 is thus still smaller than or equal to 10 μm after completing formation of the laser hole by the second laser beam 108.

Next, the geometry of the laser hole or recess 132 formed by the two-laser shot procedures described above will be described in further detail. A first portion 142 of the recess 132 directly beneath the electrically conductive layer structure 100 has been formed predominantly by the first laser beam 106 and tapers less steeply than a second portion 144 of the recess 132 beneath the first portion 142. The second portion 144 has been formed predominantly by the second laser beam 108. Hence, a first slope of the first portion 142 is lower than a second slope of the second portion 144. As a result, a (circumferential or annular) kink 146 is formed as a geometrical discontinuity at an interface between the first portion 142 and the second portion 144. The kink 146 forms an edge and defines a convex portion of the remaining electrically insulating layer structure 102. Since the size D of the second laser beam 108 has been smaller than the size L of the window 104, the kink 146 is located laterally inside of the window 104 and is visible from above as a circle.

An angle α between a vertical direction 197 and a side wall delimiting the recess 132 in the first portion 142 (for instance a first frustoconical portion) is for instance in a range between 20° and 70°, depending on the exact control of the two-shot laser process by control unit 180. An angle β between a vertical direction 197 and a side wall delimiting the recess 132 in the second portion 144 (for instance a second frustoconical portion which may or may not be coaxial with the first frustoconical portion) may be in the range between 5° and 20°, depending on the exact control of the two-shot laser process by control unit 180. The angle α is thus larger than the angle β. However, the entire side wall delimiting the recess 132 in the first portion 142 and in the second portion 144 tapers downwardly towards a vertical axis.

Referring to FIG. 4, the recess 132 or laser hole created by the removed material of the electrically insulating layer structure 102 and by the removed material of the electrically conductive layer structure 100 is filled partly or completely with electrically conductive material 138 such as copper. For this purpose, a seed layer of the electrically conductive material 138 (such as copper) may first be formed on the surface of the structure shown in FIG. 3, for example by electroless deposition. Thereafter, further electrically conductive material 138 may be plated onto the seed layer, for instance by galvanic deposition. As a result, the plate shaped PCB (printed circuit board) type component carrier 130 according to an exemplary embodiment of the invention as shown in FIG. 4 can be obtained. The electrically conductive material 138 provides an electric contact for the buried further electrically conductive layer structure 110 which can thereby be electrically connected to an exterior surface of the component carrier 130.

Figure 5:
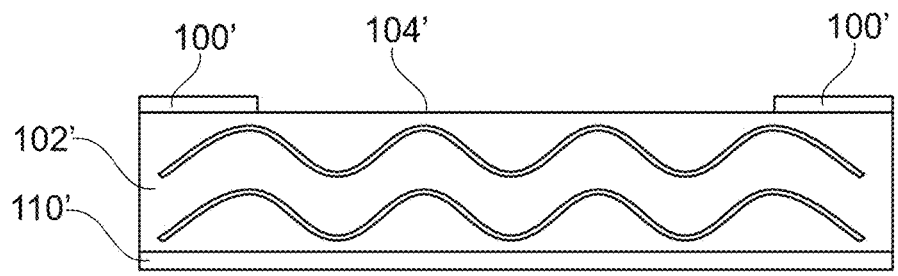
FIG. 5 and FIG. 6 illustrate cross-sectional views of structures obtained during carrying out a conventional method of manufacturing a component carrier by a combination of a photo process and a laser process.
Figure 6:
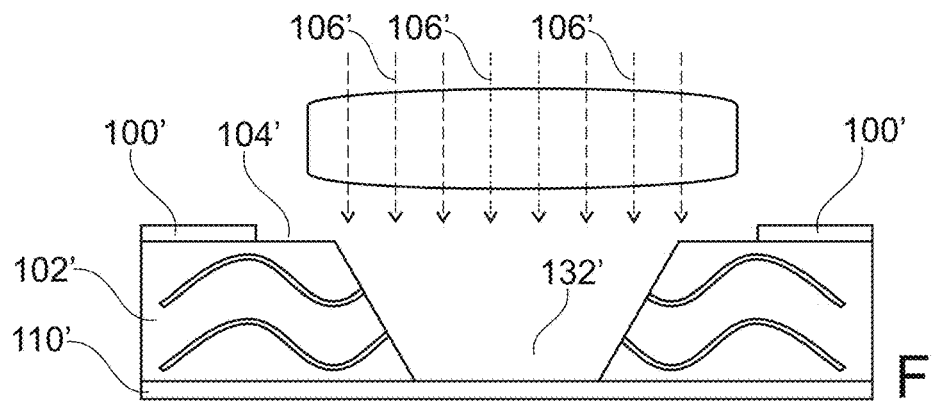

FIG. 5 and FIG. 6 illustrate cross-sectional views of structures obtained during carrying out a conventional method of manufacturing a component carrier by a combination of a photo process and a laser process.

Referring to FIG. 5, a prepreg layer 102' is covered on its bottom by a lower copper layer 110' and is covered on its top by an upper copper layer 100'. The upper copper layer 100' has been patterned by a photolithographic process to thereby form a window 104' in the upper copper layer 100'.

Referring to FIG. 6, a laser beam 106' is generated which extends through the window 104' and removes material of the prepreg layer 102' until the laser beam 106' reaches the lower copper layer 110'. Thereby, a recess 132' is formed in the prepreg layer 102'. However, forming the window 104' by a photo process in accordance with the described conventional process is time-consuming, difficult, cumbersome and limits the degree of miniaturization.

Figure 7:
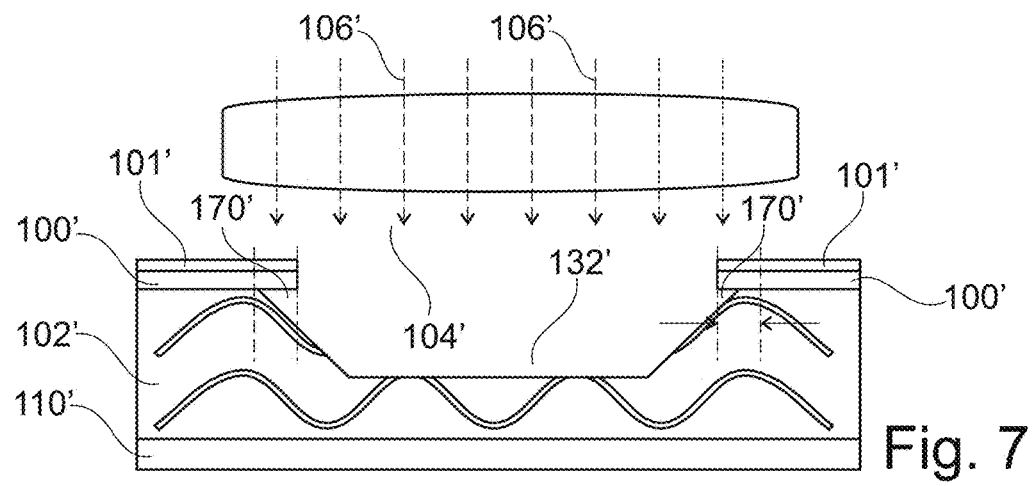
FIG. 7 and FIG. 8 illustrate cross-sectional views of structures obtained during carrying out a conventional method of manufacturing a component carrier by a combination of two laser processes.
Figure 8:
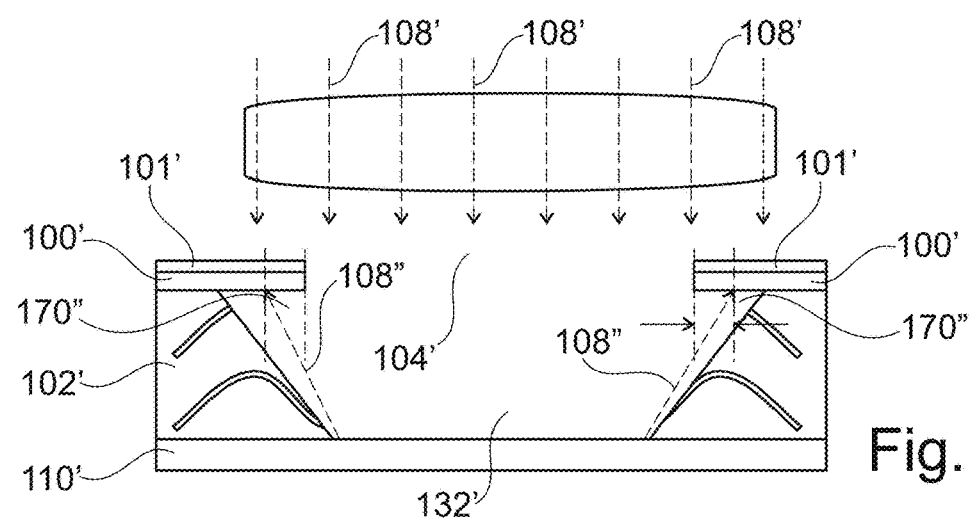

FIG. 7 and FIG. 8 illustrate cross-sectional views of structures obtained during carrying out a conventional method of manufacturing a component carrier by a combination of two laser processes.

Referring to FIG. 7, the upper copper layer 100' is covered by a protection layer 101' suppressing undesired reflection of laser light. The window 104' in the upper copper layer 100' is formed by a first laser beam 106'. Simultaneously, material of the prepreg layer 102' is removed by the first laser beam 106' to thereby form a blind hole type recess 132'. During this process, an overhang 170' is formed between the prepreg layer 102' and the upper copper layer 100'.

Referring to FIG. 8, a second laser beam 108' is generated with a size larger than the window 104'. The second laser beam 108' removes further material of the prepreg layer 102' and exposes a part of an upper main surface of the lower copper layer 110'. A significant amount of the second laser beam 108' is reflected at the exposed surface of the lower copper layer 110' due to the significant width of the second laser beam 108'. The reflected second laser beam 108', indicated with reference numeral 108" propagates towards the overhang 170' generated by the first laser beam 106' and significantly increases the overhang size, see reference numeral 170".

Thus, with the conventional procedure described referring to FIG. 7 and FIG. 8, both laser beams 106', 108' significantly contribute to the dimension of the overhang 170". Thus, the quality of the recess 132' is poor due to the large overhang 170".

Figure 9:
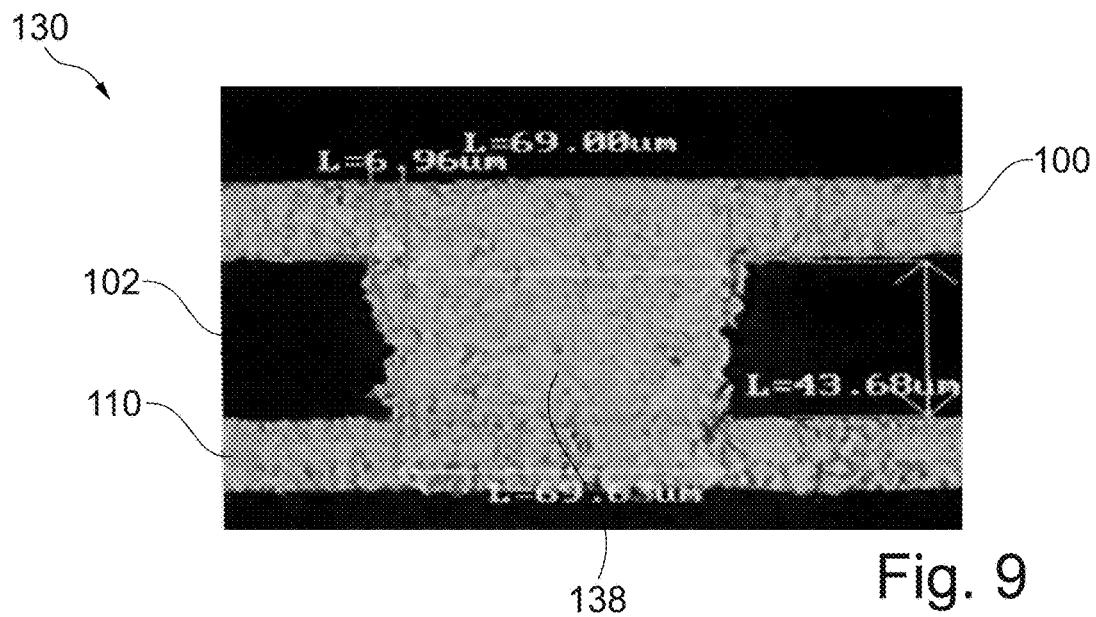
FIG. 9 illustrates a cross-sectional view of a copper filled laser via manufactured according to an exemplary embodiment of the invention.

FIG. 9 illustrates a cross-sectional view of a copper filled laser via manufactured according to an exemplary embodiment of the invention. FIG. 9 shows that the obtained overhang is acceptably small. FIG. 9 shows a trapezoid shape with through hole (and no base copper on bottom).

Figure 10:
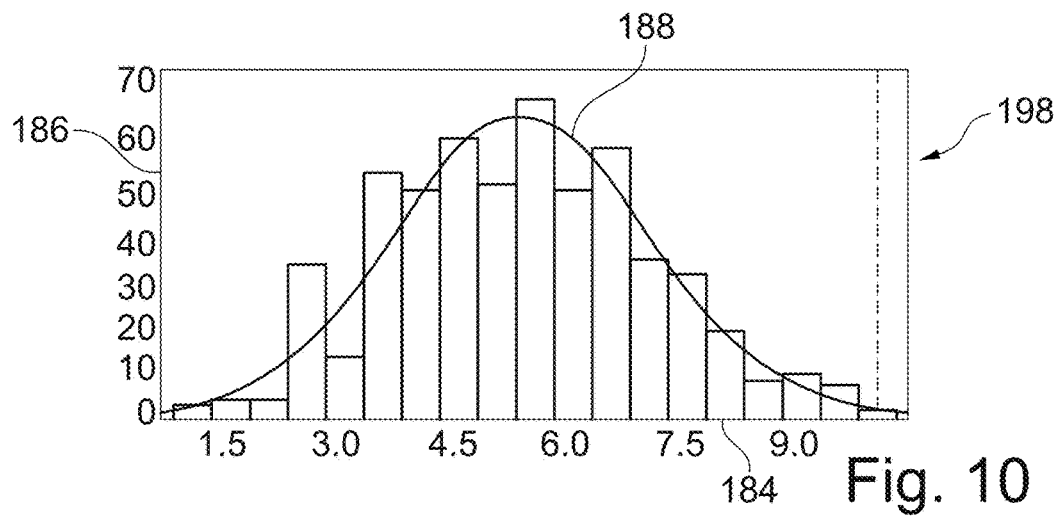
FIG. 10 illustrates a histogram showing a distribution of the overhang of laser holes manufactured according to an exemplary embodiment of the invention.

FIG. 10 illustrates a histogram 198 showing a distribution of the size of the overhang 170 of laser holes manufactured according to an exemplary embodiment of the invention. Along an abscissa 184, a value of the size of the overhang 170 is plotted in micrometer. Along an ordinate 186, a number of laser holes having the respective value of the size of the overhang 170 is plotted. A fitting curve 188 shows that an average value of the overhang 170 is around 5 μm. No significant amount of laser holes as an overhang 170 above 10 μm.

Figure 11:
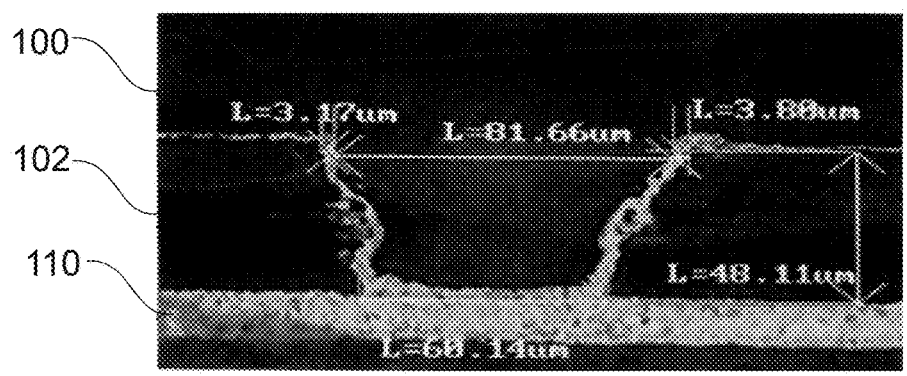
FIG. 11 illustrates a cross-sectional view of a laser via manufactured according to an exemplary embodiment of the invention.

FIG. 11 illustrates a cross-sectional view of a laser via manufactured according to an exemplary embodiment of the invention. The quality of the shown laser via is fully acceptable.

Figure 13:
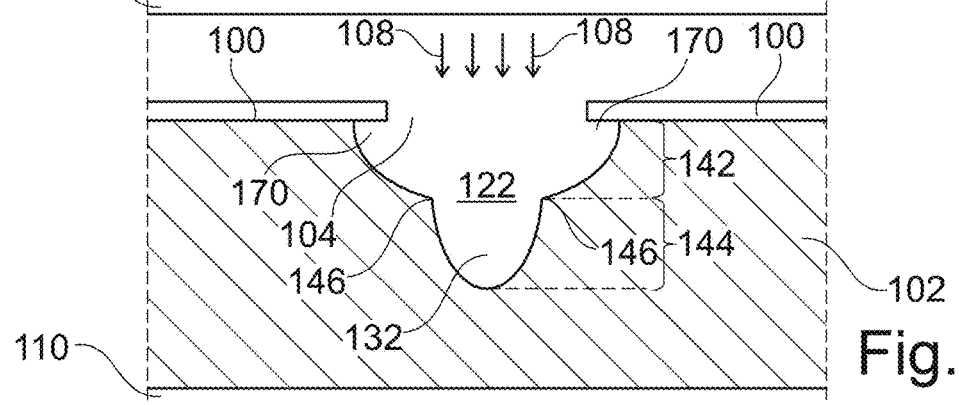
Figure 14:
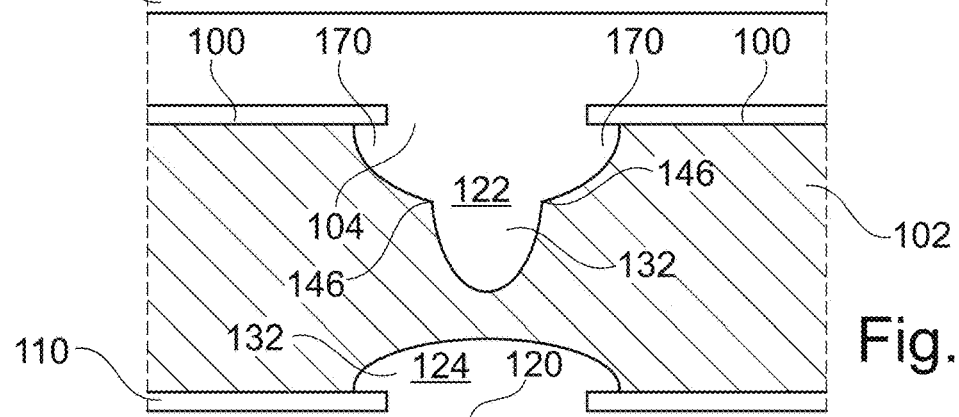
Figure 15:
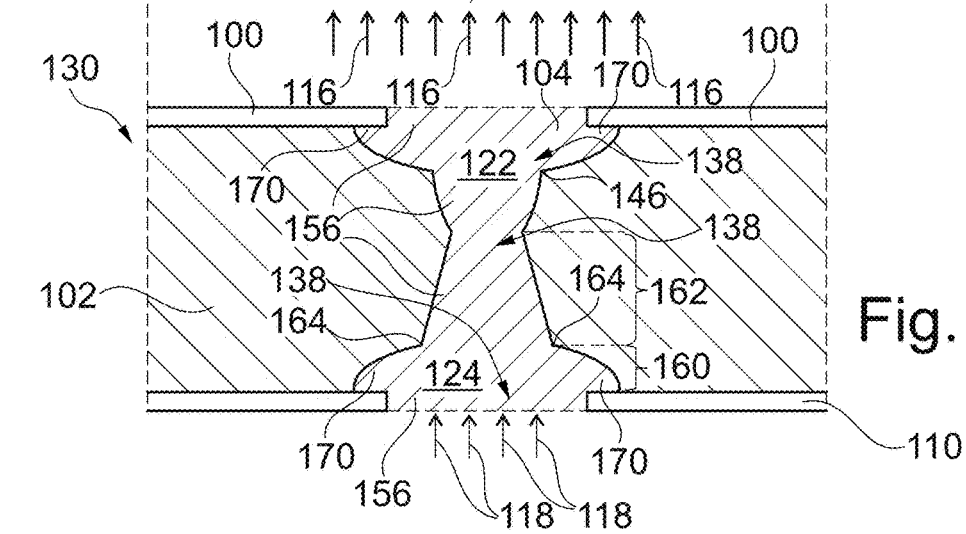
FIG. 15, by a four laser shot two-sided processing according to an exemplary embodiment of the invention.

FIG. 12 to FIG. 15 illustrate cross-sectional views of structures obtained during carrying out a method of manufacturing a component carrier 130, shown in FIG. 15, by four laser beam shot two-sided processing according to an exemplary embodiment of the invention.

Figure 12:
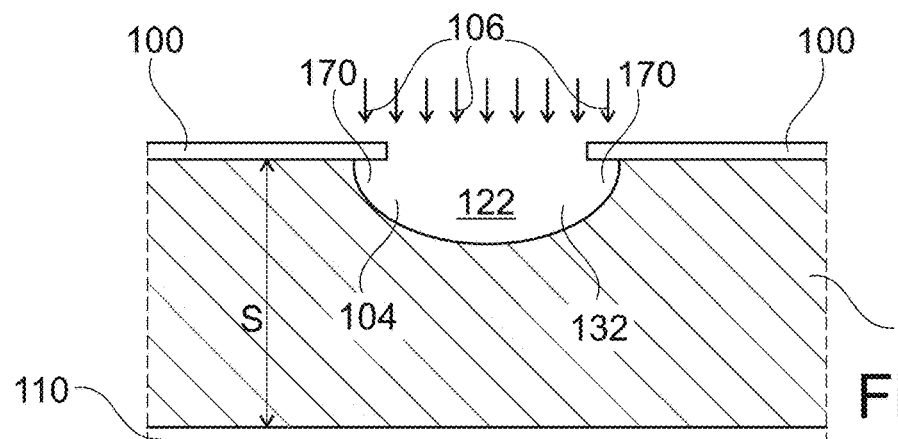

Referring to FIG. 12, an electrically insulating layer structure 102 with a pronounced thickness S is shown. For instance, the thickness S is 200 μm or more. Conventionally, it is a challenge to manufacture a smooth and high-quality copper plated laser through hole extending through such a thick electrically insulating layer structure 102, which may be for instance made of resin or FR4. As can be taken from FIG. 12, a first laser beam 106 is directed on the electrically conductive layer structure 100 on a top surface of the electrically insulating layer structure 102 to form window 104 in the electrically conductive layer structure 100 and to form a shallow first blind hole 122 in the electrically insulating layer structure 102. An undesired overhang 170 may be sufficiently small by an appropriate energy control of the first laser beam 106, as described above.

Referring to FIG. 13, the first blind hole 122 is extended in a downward direction deeper into the electrically insulating layer structure 102 by directing a second laser beam 108 having a size smaller than the width of the window 104 directly onto an exposed surface of the electrically insulating layer structure 102. Due to the described geometry, recess 132 is increased from a first depth corresponding to first portion 142 up to a second depth corresponding to the second portion 144. The portions 142, 144 are geometrically separated by kink 146.

Referring to FIG. 14, another window 120 is formed in another electrically conductive layer structure 110 covering the bottom main surface of the electrically insulating layer structure 102 by a third laser beam 116. The third laser beam 116 removes material of the electrically insulating layer structure 102 above the further window 120. Thereby, a shallow second blind hole 124 is formed in a lower portion of the electrically insulating layer structure 102. An undesired overhang 170 between the electrically insulating layer structure 102 and the further electrically conductive layer structure 110 nearby the further window 120 may be sufficiently small by an appropriate energy control of the third laser beam 116, which may be adjusted correspondingly to the energy control of the first laser beam 106.

Referring to FIG. 15, the second blind hole 124 is extended in an upward direction deeper into the electrically insulating layer structure 102 by directing a fourth laser beam 118 having a size smaller than the width of the further window 120 directly onto an exposed surface of the electrically insulating layer structure 102 from below. Due to the described geometry, the portion of the recess 132 in the lower region of FIG. 14 and FIG. 15 is further increased from a third depth corresponding to third portion 160 up to a fourth depth corresponding to a fourth portion 162. The portions 160, 162 are geometrically separated by a further kink 164.

By this procedure, the first blind hole 122 formed by the first laser beam 106 and the second laser beam 108 in a top side region of the electrically insulating layer structure 102 is connected with the second blind hole 124 formed by the third laser beam 116 and by the fourth laser beam 118 in a bottom side of the electrically insulating layer structure 102, to thereby finally form a common laser through hole through the entire thick electrically insulating layer structure 102.

Subsequently, electrically conductive material 138 may be filled in the upper part of the recess 132 and in the lower part of the recess 132. The electrically conductive material 138 forms a connected structure and extends through the entire through hole 156.

As shown, different portions of the recess 132 beneath the electrically conductive layer structure 100 taper with different steepness. Correspondingly, different portions of the other recess 132 above the other electrically conductive layer structure 100 also taper with different steepness. Due to the described process, the overhang 170 at the window 104 and at the other window 120 is smaller than or equal to 10 μm.

Figure 16:
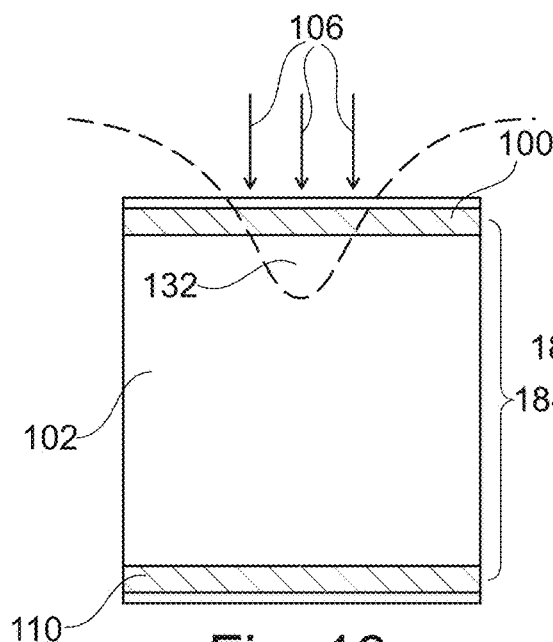
FIG. 16 and FIG. 17 illustrate cross-sectional views of structures obtained during carrying out a method of manufacturing a component carrier according to an exemplary embodiment of the invention.
Figure 17:
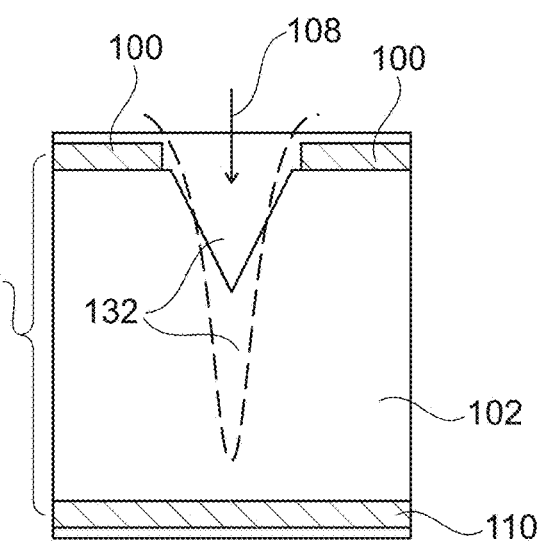

FIG. 16 and FIG. 17 illustrate cross-sectional views of structures obtained during carrying out a method of manufacturing a component carrier according to an exemplary embodiment of the invention.

Referring to FIG. 16, a procedure similar to that described above referring to FIG. 12 is illustrated again. Referring to FIG. 17, a procedure similar to that described above referring to FIG. 13 is illustrated again.

With the procedure described referring to FIG. 12 to FIG. 17, laser through holes on thick cores 188 (see FIG. 16 and FIG. 17) can be formed with small overhang 170.

For an electrically insulating layer structure 102 (such as a core, in particular made of fully cured dielectric material) with a thickness of 200 μm or higher, forming a laser through hole would require a high-power machine to achieve stable opening and middle diameters. Indeed, processing with low power will not allow a consistent middle diameter even with high number of shots as most of the laser energy will be diffused through the through holes instead of removing the resin on the wall.

Producing with high power has also its limitation as it tends to create larger and instable overhang and therefore the resin opening capability gets lower as the standard deviation gets higher.

In order to produce laser through holes with high quality with a stable process on standard low power machines, an exemplary embodiment of the invention uses the open window concept described above to separate the processing of the opening and the middle diameter. Indeed, the first laser shots on both sides (front and back) of the electrically insulating layer structure 102 (compare reference numerals 106, 116 in FIG. 12 and FIG. 14) may be used to open the respective window 104, 120 and focuses on the window opening where the overhang 170 is low and stable. Then the following laser shots (compare reference numerals 108, 118 in FIG. 13 and FIG. 15) may focus only on the middle diameter by using high power shots. Indeed, by being able to process with smaller laser beam size during the subsequent laser shots (compare reference numerals 108, 118 in FIG. 13 and FIG. 15), it is possible to amplify the energy density which renders it possible to process with high peak power. The latter highly advantageous measure would not be possible if the copper material of the respective electrically conductive layer structure 100, 110 was not opened in advance. If used on copper with pre-opened laser windows 104, 120, this kind of beam characteristics may open even very small vias (for instance having a size of 40 μm) with low copper overhang 170.

Figure 18:
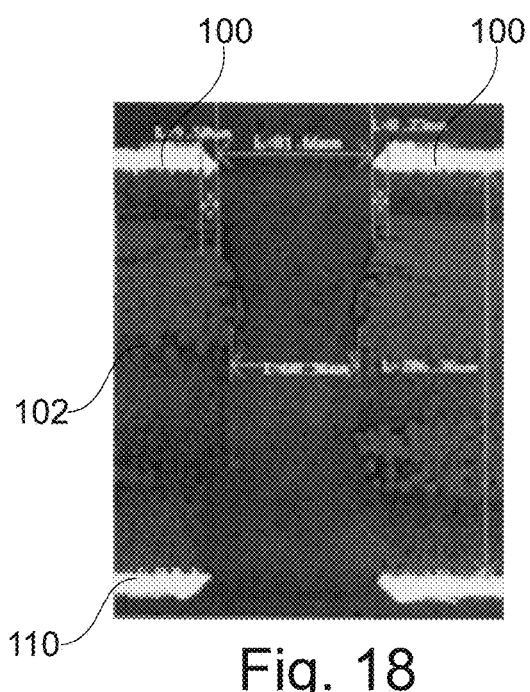
FIG. 18 and FIG. 19 illustrate cross-sectional views of laser vias manufactured according to an exemplary embodiment of the invention corresponding to FIG. 12 to FIG. 15.
Figure 19:
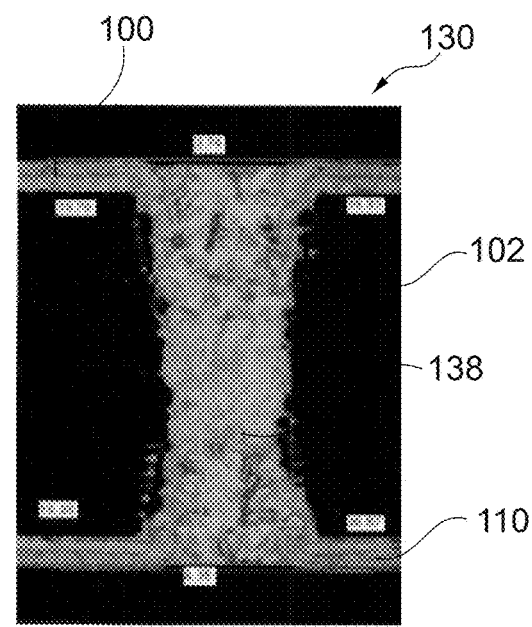

FIG. 18 and FIG. 19 illustrate cross-sectional views of laser vias manufactured according to an exemplary embodiment of the invention corresponding to FIG. 12 to FIG. 17.

Figure 20:
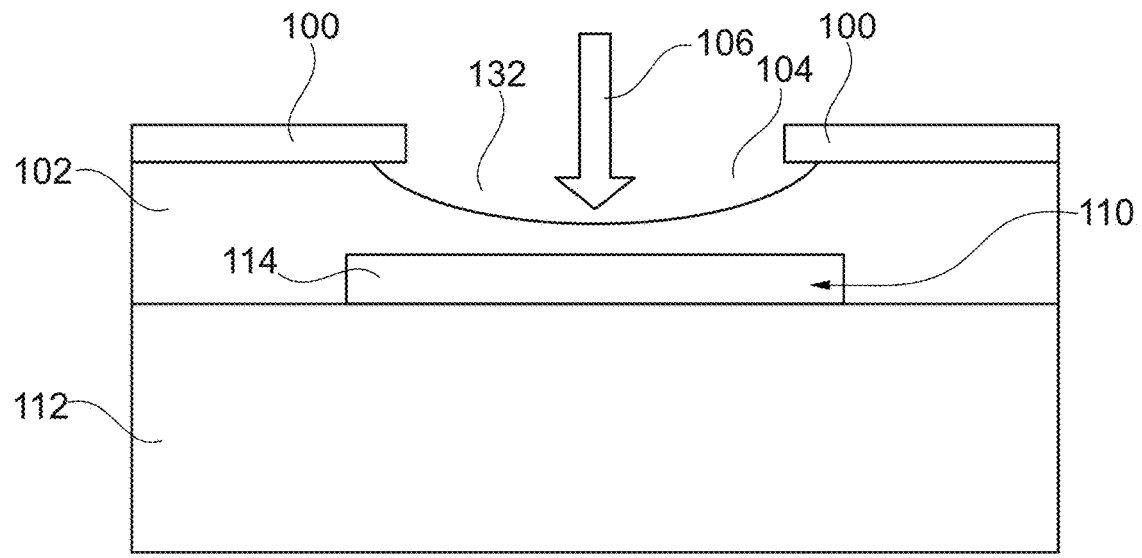
FIG. 20 and FIG. 21 illustrate cross-sectional views of structures obtained during carrying out a method of manufacturing a component carrier with embedded component electrically contacted by a laser via according to an exemplary embodiment of the invention.
Figure 21:
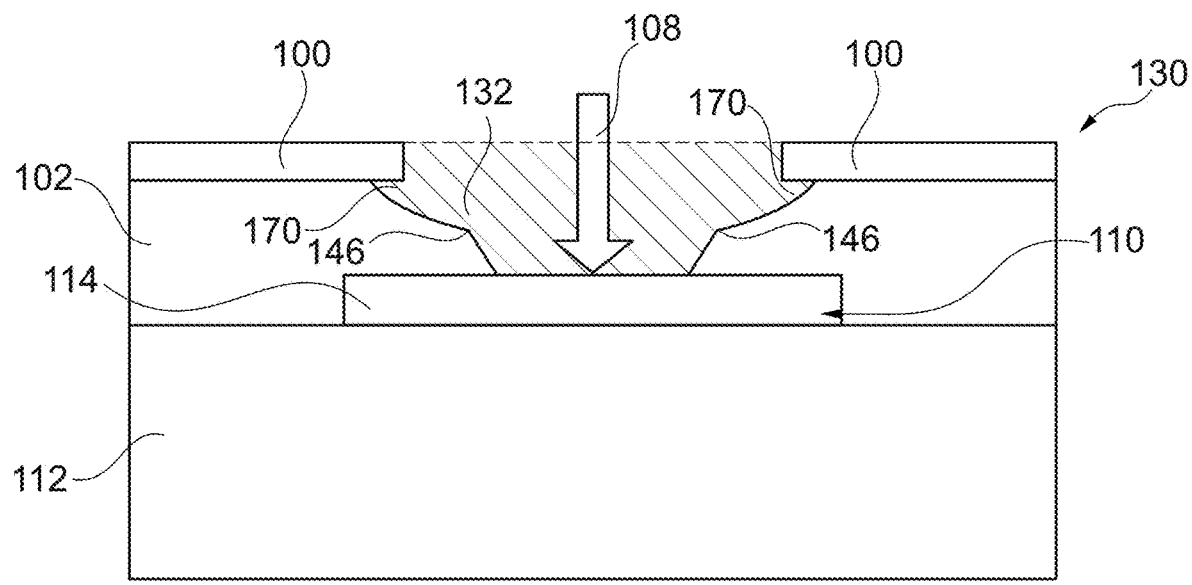

FIG. 20 and FIG. 21 illustrate cross-sectional views of structures obtained during carrying out a method of manufacturing a component carrier 130 with embedded component 112 according to an exemplary embodiment of the invention.

Referring to FIG. 20, an embedded component 112 (such as a semiconductor chip) with a pad 114 is shown being embedded below an electrically insulating layer structure 102, as described above. When exposing the pad 114 by laser drilling for forming an exterior electrically conductive contact for contacting the component 112 with an exterior of the component carrier 130 to be manufactured, the pad 114 corresponds to the further electrically conductive layer structure 110 of the previously described embodiments. FIG. 20 illustrates how a window 104 is opened in the electrically conductive layer structure 100 and the shallow recess 132 is formed in the electrically insulating layer structure 102 by the first laser beam 106 (as described in detail in FIG. 2). The recess 132 however does not yet extend up to the pad 114 which therefore remains embedded after the first laser shot.

Referring to FIG. 21, two further procedures are shown which are carried out one after the other. Firstly, after having obtained the structure shown in FIG. 20, the second laser beam 108 with smaller size compared to the size of the window 104 is directed directly towards the dielectric material of the electrically insulating layer structure 102 until an upper main surface of the pad 114 of the component 112 is exposed by the second laser shot. Thereafter, the so obtained recess 132 is filled with electrically conductive material 138, for instance by copper plating.

The procedure described referring to FIG. 20 and FIG. 21 shows that an even sensitive component 112 can be gently exposed for electric contact purposes by configuring the first laser beam 106 only for window opening and a slight material removal in an upper region of the electrically insulating layer structure 102. The actual contact with the pad 114 is then established by the cleaning narrower second laser beam 108.

Hence, FIG. 20 and FIG. 21 show a process of electrically connecting the component 112 using a $CO_2$ laser to drill the thin dielectric material in form of the electrically insulating layer structure 102.

Using a $CO_2$ laser for direct laser drilling is generally avoided to connect components 112. Indeed, when opening the copper material of the electrically conductive layer structure 100, the high generated heat can easily reach the component 112 and damage the thin copper pad 114 (which may typically have a thickness in the range between 3 μm and 6 µm) of the one or more components 112. Therefore, conformal mask, large window and other laser sources are conventionally used in component carrier related applications with embedded components 112.

However, when applying the open window processing architecture according to FIG. 20 and FIG. 21 according to an exemplary embodiment of the invention, it has turned out to be easy to create the copper connections as the first unstable (compare FIG. 25) shot with the first laser beam 106 used for opening the window 104 in the electrically conductive layer structure 100 will not reach the one or more sensitive components 112 beneath (compare FIG. 20). Only the narrower second laser beam 108 will then accomplish the actual electric contacting task by exposing the pads 114.

Figure 22:
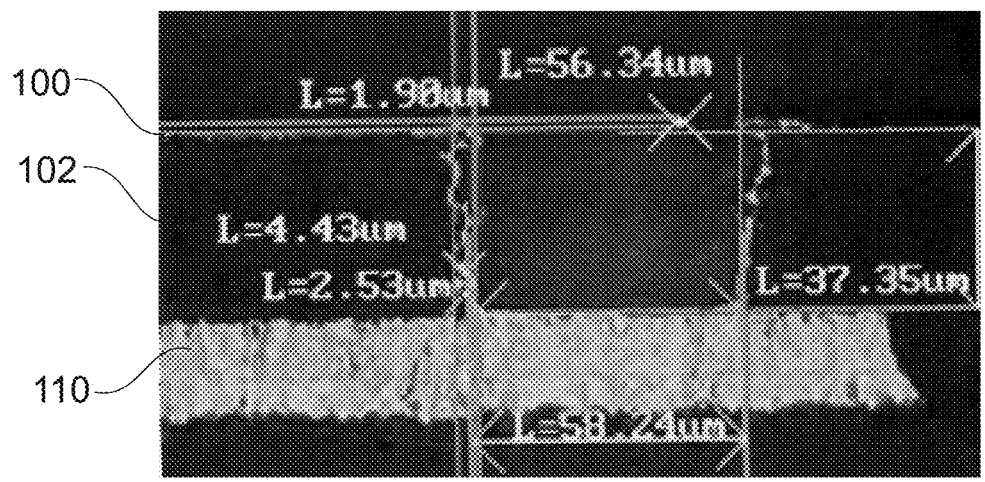
FIG. 22 and FIG. 23 illustrate cross-sectional views of laser vias manufactured according to an exemplary embodiment of the invention.
Figure 23:
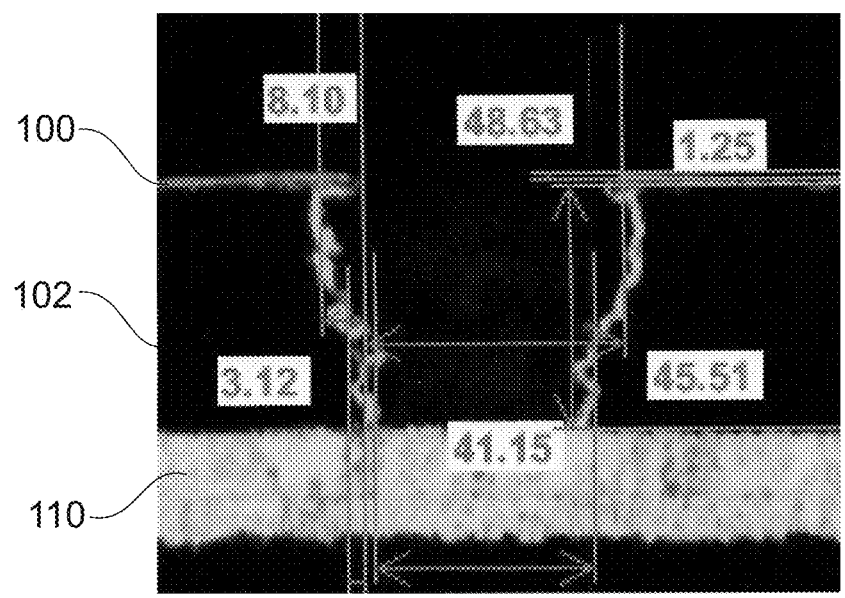

FIG. 22 and FIG. 23 illustrate cross-sectional views of laser vias manufactured according to exemplary embodiments of the invention.

Referring to FIG. 22, the result of a direct laser drilling process without previous surface treatment of an upper main surface of the electrically conductive layer structure 100 is shown. Neither surface treatment nor the attachment of a protective bond film, black oxide, etc. for suppressing reflection of laser radiation is necessary with the described procedure.

Referring to FIG. 23, a laser via with a window size of approximately 50 µm, an overhang 170 of not more than 10 µm and a dielectric dimension of about 40 µm is shown. Thus, the two-laser shot procedure as described above is particularly suitable for small vias size.

Next, some considerations will be described as a basis for the subsequent description of an embodiment according to the second aspect of the invention to which also FIG. 24 in combination with FIG. 25 refers.

Processing with a laser provides high throughput as it allows processing with wider beams and higher energy level to remove the maximum possible material (of a conductive layer or an insulator). However, a $CO_2$ laser is characterized by an excessive heat generation that gets worst knowing that the conductive layer reflects in many cases more than 80% of the provided $CO_2$ laser energy requiring then processing at high energy level to allow that the copper melts and is removed.

The high energy level and the excessive heat generation removes and burns a high amount of the dielectric material impacting then the via quality in terms of copper overhang and poor roughness on the via wall, while it also prevents controlling the processing depth. Indeed, for thin dielectric material (for instance with a thickness in the range from 15 µm to 35 µm), the first shot with a $CO_2$ laser beam needed for a stable, predictable, reliable and reproducible opening of a window in a copper layer, may already reach the bottom of the electrically insulating layer structure and therefore creates even more overhang due to laser reflection phenomena, damages to components beneath in case of embedding, and/or induces bottle holes in case of laser through holes.

As opening the copper with high energy is one of the main root causes for the above and other defects, it may be considered to process with low energy. However, producing with lower energy level may also induce smaller connection diameters, a need for more shots as the following shots will have the same energy level.

To overcome such and other limitation, an exemplary embodiment of the invention opens the copper, or more generally the electrically conductive layer structure, differently. For example, when using a large window process that involves the procedure of removing copper using an etching process and then the remaining dielectric by laser treatment, the defects above do not exist. Nevertheless, a large window process is a time-consuming and expensive solution as it requires an additional photo process.

According to an exemplary embodiment of the invention, an open window laser drilling procedure may be implemented which may comprise opening the copper window in the electrically conductive layer structure by a special laser processing treatment (corresponding to FIG. 2) and then remove the remaining dielectric of the electrically insulating layer structure by one or more additional independent laser beams having a smaller size than the window (corresponding to FIG. 3). In this way, it has turned out to be possible to overcome the registration issue that might induce partially opened vias. Furthermore, this may also allow to avoid or at least strongly suppress a reflection of the laser beam on the via wall creating larger overhangs.

Figure 24:
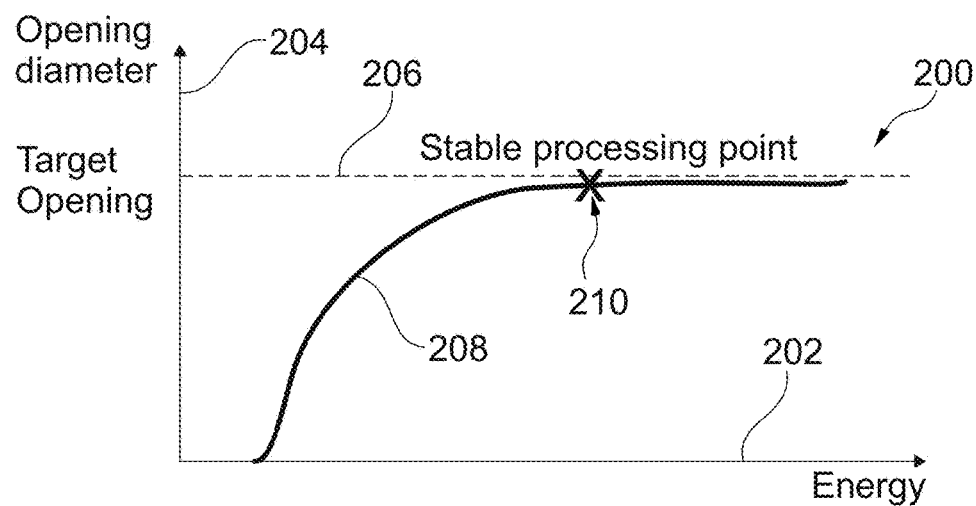
FIG. 24 illustrates a diagram showing a dependency between the energy of a laser beam and an opening diameter of a window in an electrically conductive layer structure in an operation mode with a stable processing point.

FIG. 24 illustrates a diagram 200 showing a dependency between the energy (plotted along an abscissa 202) of a laser beam 106 and an opening diameter (plotted along an ordinate 204) or size of a window 104 in an operation mode with a stable processing point 210. The mentioned dependency is indicated by a curve 208.

The curve 208 of the diagram 200 shows that, when the energy increases, the size or opening diameter of the window 104 increases as well. In a low energy region, the curve 208 increases with a significant slope. From a certain energy onwards, the described dependency is no longer valid: In contrast to this, the curve 208 approaches at higher energy levels a plateau or asymptote indicated as target opening 206 in FIG. 24. In this region, a further increase of the laser energy does not result in a significant further increase of the opening diameter. Descriptively speaking, the additional energy in this regime will then result in a significant burning of resin material of the electrically insulating layer structure 102.

During copper opening (more generally during opening a window 104 in an electrically conductive layer structure 100, 110 by a laser beam 106), the laser energy is high and when processing in the stable zone around stable processing point 210 (maximum copper opening for a given aperture or mask), the heat tends to dissipate in the via depths to remove more resin and reach the bottom or on the via wall to remove and burn more resin and then create more overhang 170 as the copper opening does not get larger.

It can therefore be concluded from FIG. 24 that the mere increase of the laser energy does not allow obtaining the desired result of a reduced overhang 170.

Figure 25:
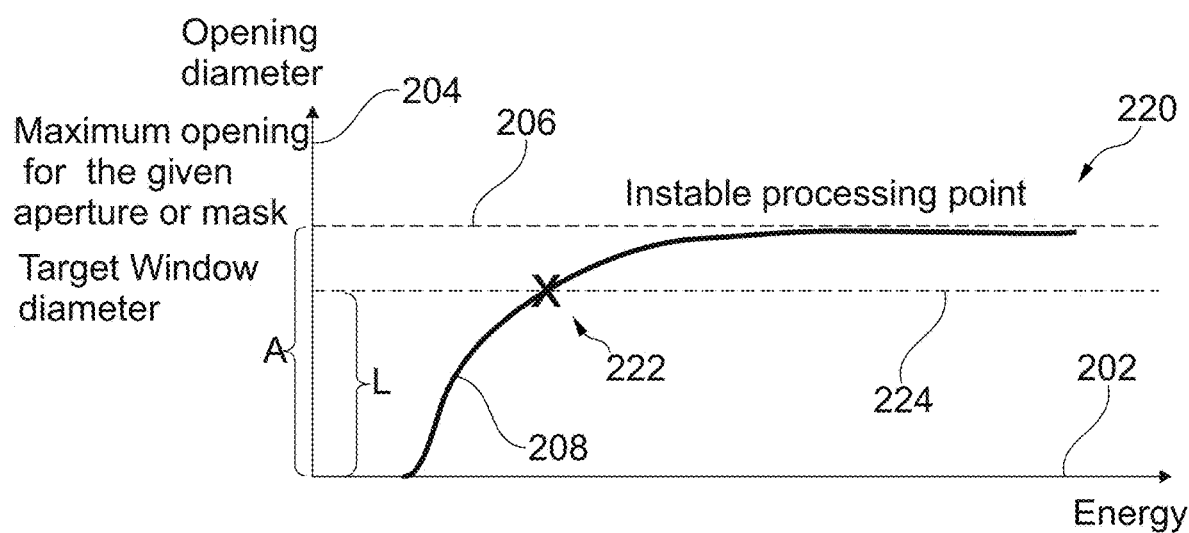
FIG. 25 illustrates a diagram showing a dependency between the energy of a laser beam and an opening diameter of a window in an electrically conductive layer structure in an operation mode according to an exemplary embodiment of the invention with an instable processing point.

FIG. 25 illustrates a further diagram 220 showing a dependency between the energy (again plotted along abscissa 202) of laser beam 106 and the opening diameter (plotted again along ordinate 204) or size of window 104 in an operation mode according to an exemplary embodiment of the invention with an instable processing point 222. Descriptively speaking, an exemplary embodiment of the invention does not intend to adjust the energy of the laser beam 106 so as to operate the laser at the stable processing point 210 as close as possible at the maximum opening for the given aperture or mask. In contrast to this, an exemplary embodiment of the invention operates the laser and correspondingly adjust the laser energy so as to operate the first laser beam 106 at the instable processing point 222.

By opening window 104 by the first laser beam 106 adjusted at the instable processing point 222, it is highly advantageously possible to promote a horizontal heat dissipation by giving more room to open the window 104 in the copper material of the electrically conductive layer structure 100, 110 rather than drilling a deeper via.

In the instable processing point 222 above, the provided laser beam energy may be mostly used and focused on opening the window 104 in the electrically conductive layer structure 100, 110 and creating larger via while only a portion of the dielectric material of the electrically insulating layer structure 102 will be removed. In this case, the overhang 170 may be advantageously lower. In the presence of one or more embedded components 112, the latter will not be harmed and there will be no risk for bottle holes in case of laser through holes.

In view of the foregoing, a preferred embodiment of the invention forms the window 104 in the electrically conductive layer structure 100 and removes material of the electrically insulating layer structure 102 below the window 104 by the laser beam 106 being configured for promoting heat transfer in the electrically conductive layer structure 100 in horizontal direction and inhibiting heat transfer in vertical direction (which would only remove more material of the electrically insulating layer structure 102). More specifically, the method may comprise promoting heat transfer in horizontal direction and inhibiting heat transfer in the vertical direction by correspondingly adjusting the energy impact of the laser beam 106 on the electrically conductive layer structure 100 and the electrically insulating layer structure 102 in accordance with instable processing point 222.

In a particularly preferred embodiment and again referring to FIG. 25, the method comprises adjusting the energy of the laser beam 106 so that the size L of the window 104 (compare target window diameter 224) is obtained which is smaller than or equal to 90% of a maximum opening size A for a given aperture. The size L of the window 104 corresponds to the instable processing point 222, whereas the maximum open size A substantially corresponds to a stable processing point 210 shown in FIG. 24. In particular, the mentioned ratio may be in a range between 60% and 90%, and most preferred between 70% and 85% of a maximum opening size A for a given aperture. In such a scenario, a particularly small overhang 170 may be obtained.

Figure 26:
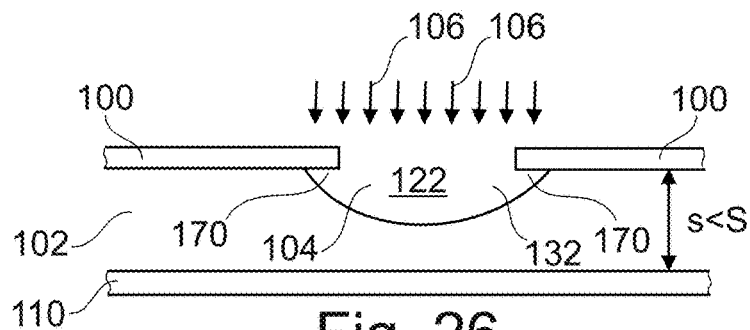
FIG. 26, FIG. 27 and FIG. 28 illustrate cross-sectional views of structures obtained during carrying out a method of manufacturing a component carrier with a laser via, using as an alternative to the embodiment of FIG. 12 to FIG. 15, a three-laser shot two-sided processing according to an exemplary embodiment of the invention.
Figure 27:
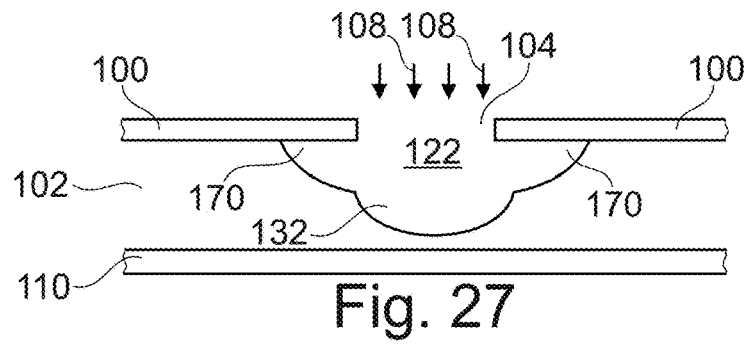
Figure 28:
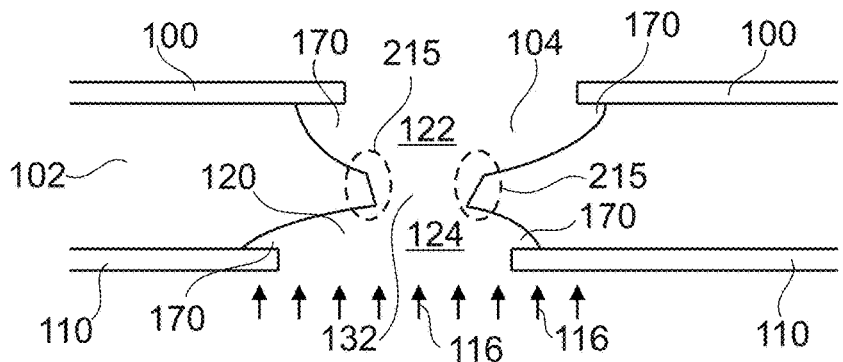

FIG. 26 to FIG. 28 illustrate cross-sectional views of structures obtained during carrying out a method of manufacturing a component carrier 130 with a laser via, using as an alternative to the embodiment of FIG. 12 to FIG. 15, a three-laser shot two-sided processing according to an exemplary embodiment of the invention. This procedure is in particular appropriate for a thin electrically insulating layer structure 102 (in particular core), as indicated with thickness "s" in FIG. 26 being smaller than thickness "S" of FIG. 12. For instance, thickness s may be smaller than 100 µm, for instance in a range between 30 µm and 70 µm.

Referring to FIG. 26, first laser beam 106 is directed on the electrically conductive layer structure 100 on a top surface of the electrically insulating layer structure 102 to form window 104 in the electrically conductive layer structure 100 and to form a shallow first blind hole 122 in the electrically insulating layer structure 102. An undesired overhang 170 may be sufficiently small by an appropriate energy control of the first laser beam 106, as described above.

Referring to FIG. 27, the first blind hole 122 is extended in a downward direction deeper into the electrically insulating layer structure 102 by directing a second laser beam 108 having a size smaller than the width of the window 104 directly onto an exposed surface of the electrically insulating layer structure 102. Due to the described geometry, the depth of recess 132 is increased.

Referring to FIG. 28, another window 120 is formed in the other electrically conductive layer structure 110 covering the bottom main surface of the electrically insulating layer structure 102 by third laser beam 116. The third laser beam 116 removes material of the electrically insulating layer structure 102 above the further window 120, so that the first blind hole 122 formed by the first laser beam 106 and the second laser beam 108 in a top side region of the electrically insulating layer structure 102 is connected with second blind hole 124 formed by the third laser beam 116 in a bottom side of the electrically insulating layer structure 102. Thereby, a common laser through hole extending through the entire electrically insulating layer structure 102 is formed with three laser shots (in contrast to four laser shots in the embodiment according to FIG. 12 to FIG. 15). As can be taken from a detail 215 in FIG. 28, the described procedure may result in a slanted sidewall in the narrowest region of the laser through hole. The described procedure is very simple and quick, since three laser shots are enough for producing a laser through hole.

The laser through hole according to FIG. 28 also shows a lateral offset, see position of the second blind hole 124 compared to first blind hole 122. This results from the fact that, after the first and the second laser shots, the preform of the component carrier 130 (i.e. the processed panel) can be flipped (i.e. turned by 180°), before the third laser shot is carried out. This introduces a spatial inaccuracy in the lateral direction which results in the described offset.

Subsequently but not shown for the present embodiment, electrically conductive material 138 may be filled in the upper part of the recess 132 and in the lower part of the recess 132 so as to form a connected electrically conductive structure which extends through the entire through hole 156.

Figure 29:
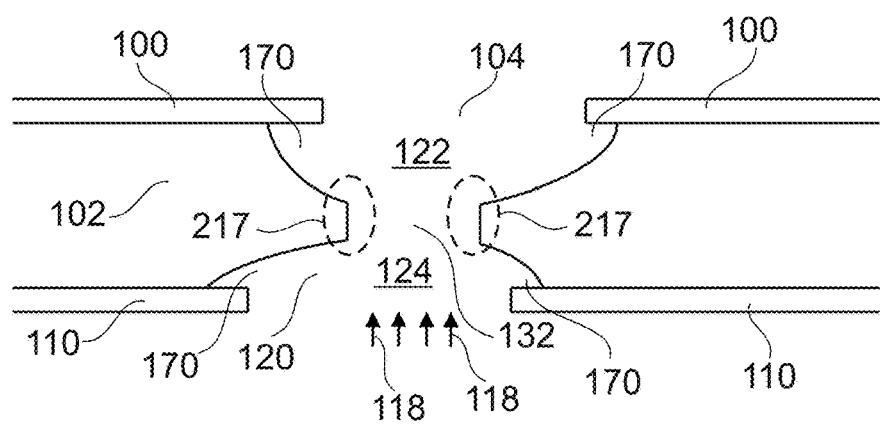
FIG. 29 shows the result of a further procedure following the procedure according to FIG. 26 to FIG. 28 to obtain a more symmetric sidewall in a central portion of the through hole according to an exemplary embodiment of the invention.

FIG. 29 shows the result of a further optional procedure following the procedure according to FIG. 26 to FIG. 28 but being executed prior to filling electrically conductive material 138 in the laser through hole. This procedure allows obtaining a more symmetric sidewall in a central portion of the through hole according to an exemplary embodiment of the invention. In this embodiment, the through hole shown in FIG. 28 is extended by directing a fourth laser beam 118 having a size smaller than the width of the further window 120 directly onto an exposed surface of the electrically insulating layer structure 102 adjacent to the narrowest portion of the through hole. As can be taken from a detail 217, the previously slanted sidewalls in the innermost portion (see detail 215 in FIG. 28) may be rendered more vertical or even fully vertical. Thus, the optional but advantageous fourth laser shot may render the through hole more symmetric in the bottleneck region. This reduces the stress area and allows a better and more reliable wire connection.

Summarizing, the embodiment of FIG. 26 to FIG. 29 connects first blind hole 122 formed by the first laser beam 106 and the second laser beam 108 in a top side region of the electrically insulating layer structure 102 with second blind hole 124 formed in a bottom side region of the electrically insulating layer structure 102 by the third laser beam 116 only. Thereby, through hole 156 is formed which extends through the entire electrically insulating layer structure 102. Thereafter, a narrowest portion of the through hole 156 can be rendered more vertical by fourth laser beam 118 having a smaller size than the other window 120.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method, comprising:
providing an electrically conductive layer structure on top of an electrically insulating layer structure;
forming a window in the electrically conductive layer structure and removing material of the electrically insulating layer structure below the window by a first laser beam;
subsequently removing further material of the electrically insulating layer structure below the window by a second laser beam having a smaller size than a size of the window;
wherein the first laser beam is configured to introduce more of its energy horizontally into the electrically conductive layer structure than vertically into the electrically insulating layer structure;
wherein the first laser beam is configured to introduce its energy substantially horizontally when opening the window in the electrically conductive layer structure;
wherein the first laser beam and the second laser beam are independent from one another, in particular are adjusted concerning their properties, in particular concerning their energy, independent from each other.

2. The method according to claim 1, comprising at least one of the following features:
wherein the second laser beam has a smaller size than a larger size of the first laser beam;
wherein the method comprises directing the second laser beam entirely through the window onto the electrically insulating layer structure.

3. The method according to claim 1, further comprising:
providing a further electrically conductive layer structure at a bottom of the electrically insulating layer structure, and removing material of the electrically insulating layer structure by the first laser beam only to such an extent that the further electrically conductive layer structure is not exposed by the first laser beam.

4. The method according to claim 3, wherein the method comprises at least one of the following features:
removing material of the electrically insulating layer structure by the second laser beam to such an extent that the further electrically conductive layer structure is at least partially exposed by the second laser beam;
embedding a component below at least part of the electrically insulating layer structure, wherein the further electrically conductive layer structure is a pad of the component.

5. The method according to claim 1, wherein the method comprises at least one of the following features:
after the removing of the material by the second laser beam, removing other material, in particular other material of the electrically insulating layer structure, by at least one third laser beam propagating through the window and having a smaller size than the window;
wherein a ratio between a size of the window and a size of the second laser beam is larger than or equal to 1.1, in particular is larger than or equal to 1.2;
wherein a difference between a size of the window and a size of the second laser beam is in a range between 3 µm and 50 µm, in particular in a range between 5 µm and 15 µm;
wherein the method comprises generating at least one of the first laser beam and the second laser beam by a $CO_2$ laser;
wherein the method comprises at least partially filling at least one of the window and a recess created by removing material of the electrically insulating layer structure with electrically conductive material, in particular by plating;
wherein the method comprises directing the first laser beam directly onto the electrically conductive layer structure, in particular without protection of the electrically conductive layer structure by a protection film and/or without previous surface treatment of the electrically conductive layer structure.

6. The method according to claim 1, further comprising:
providing another electrically conductive layer structure on a bottom of the electrically insulating layer structure;
forming another window in the other electrically conductive layer structure and removing material of the electrically insulating layer structure above the other window by a third laser beam;
optionally subsequently removing still further material of the electrically insulating layer structure above the other window by a fourth laser beam having a smaller size than the other window.

7. The method according to claim 6, comprising one of the following features:
wherein the method comprises connecting a first blind hole formed by the first laser beam and the second laser beam in a top side region of the electrically insulating layer structure with a second blind hole formed by the third laser beam and by the fourth laser beam in a bottom side region of the electrically insulating layer structure to thereby form a through hole extending through the entire electrically insulating layer structure;
wherein the method comprises connecting a first blind hole formed by the first laser beam and the second laser beam in a top side region of the electrically insulating layer structure with a second blind hole formed in a bottom side region of the electrically insulating layer structure by the third laser beam only, to thereby form a through hole extending through the entire electrically insulating layer structure,
wherein the method optionally comprises rendering a narrowest portion of the through hole more vertical by a fourth laser beam having a smaller size than the other window.

8. A method, comprising:
providing an electrically conductive layer structure on an electrically insulating layer structure;
forming a window in the electrically conductive layer structure and removing material of the electrically insulating layer structure below the window by a laser beam configured for promoting heat transfer in the electrically conductive layer structure in horizontal direction and inhibiting heat transfer in vertical direction.

9. The method according to claim 8, wherein the method comprises at least one of the following features:
promoting heat transfer in the horizontal direction and inhibiting heat transfer in the vertical direction by operating the laser beam at an instable processing point;
wherein the method comprises promoting heat transfer in the horizontal direction and inhibiting heat transfer in the vertical direction by correspondingly adjusting the energy impact of the laser beam on the electrically conductive layer structure and the electrically insulating layer structure;

wherein the method comprises adjusting an energy of the laser beam so that a size of the window is obtained which is smaller than or equal to 90% of a maximum opening size for a given aperture, in particular which is in a range between 60% and 90%, more particularly between 70% and 85%, of a maximum opening size for a given aperture;

wherein the method comprises removing further material of the electrically insulating layer structure by a further laser beam having a smaller size than at least one of a size of the window and a size of the laser beam.

10. A component carrier, comprising:
an electrically insulating layer structure;
an electrically conductive layer structure on top of the electrically insulating layer structure;
a window in the electrically conductive layer structure;
a recess in the electrically insulating layer structure below the window, wherein an overhang of the electrically conductive layer structure with respect to the electrically insulating layer structure at an edge of the window is smaller than or equal to 10 µm;
electrically conductive material in at least part of the recess;
wherein a first portion of the recess directly beneath the electrically conductive layer structure tapers less steeply than a second portion of the recess beneath the first portion.

11. The component carrier according to claim 10, wherein a first slope of a first portion of the recess directly beneath the electrically conductive layer structure is lower than a second slope of a second portion of the recess beneath the first portion.

12. The component carrier according to claim 10, wherein the recess has a kink between the first portion and the second portion.

13. The component carrier according to claim 12, comprising at least one of the following features:
wherein the kink is located inside of the window;
wherein the electrically insulating layer structure is convex in a region around the kink.

14. The component carrier according to claim 10, comprising at least one of the following features:
wherein an angle between a vertical direction and a side wall delimiting the recess in the first portion is smaller than 90°, in particular is in a range between 20° and 70°;
wherein an angle between a vertical direction and a side wall delimiting the recess in the second portion is in a range between 0° and 30°, in particular between 5° and 20°;
wherein an angle between a vertical direction and a side wall delimiting the recess in the first portion is larger than an angle between a vertical direction and a side wall delimiting the recess in the second portion;
wherein a side wall delimiting the recess in the second portion tapers downwardly towards a vertical axis.

15. The component carrier according to claim 10, comprising at least one of the following features:
wherein the window has a size of not more than 70 µm, in particular not more than 50 µm;
wherein a thickness of the electrically insulating layer structure is at least 100 µm, in particular is at least 150 µm, more particularly is at least 200 µm.

16. The component carrier according to claim 10, further comprising:
another electrically conductive layer structure on a bottom of the electrically insulating layer structure;
a further window in the other electrically conductive layer structure; another recess in the electrically insulating layer structure above the further window;
wherein the electrically conductive material fills at least part of the other recess.

17. The component carrier according to claim 16, comprising at least one of the following features:
wherein different portions of the recess beneath the electrically conductive layer structure taper with different steepness, and wherein different portions of the other recess above the other electrically conductive layer structure taper with different steepness;
wherein an overhang of the other electrically conductive layer structure with respect to the electrically insulating layer structure at an edge of the other window is smaller than or equal to 10 µm.

18. The component carrier according to claim 10, comprising at least one of the following features:
wherein a thickness of the electrically conductive layer structure is less than 5 µm, in particular less than 3.5 µm, more particularly less than or equal to 3 µm;
the electrically conductive layer structure comprises at least one of a group consisting of copper, aluminum, nickel, silver, gold, palladium, and tungsten, any of the mentioned materials being optionally coated with supra-conductive material such as graphene;
the electrically insulating layer structure comprises at least one of a group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
wherein the component carrier comprises at least one component, in particular at least one of an embedded component and a surface mounted component, wherein the at least one component is in particular selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a light guiding element, a further component carrier and a logic chip;
the component carrier is shaped as a plate;
the component carrier is configured as a printed circuit board, or a substrate.

19. A component carrier, comprising:
an electrically insulating layer structure;
an electrically conductive layer structure on a front side of the electrically insulating layer structure and having a window;
another electrically conductive layer structure on a back side of the electrically insulating layer structure and having another window;

a through hole extending through the electrically insulating layer structure and being at least partially filled with electrically conductive material, wherein the through hole is formed by a recess extending from the window into the electrically insulating layer structure and by another recess connected to the recess and extending from the other window into the electrically insulating layer structure;

wherein different portions of the recess taper with different steepness;

wherein different portions of the other recess taper with different steepness;

wherein a first portion of the recess directly underneath the electrically conductive layer structure tapers less steep than a second portion of the recess underneath the first portion;

wherein a third portion of the other recess directly above the other electrically conductive layer structure tapers less steep than a fourth portion of the other recess above the third portion.

20. The component carrier according to claim 19, further comprising:

a first kink between the first portion and the second portion.

21. The component carrier according to claim 19, further comprising:

a second kink between the third portion and the fourth portion.

* * * * *